United States Patent
Chung et al.

(10) Patent No.: US 10,211,847 B1
(45) Date of Patent: Feb. 19, 2019

(54) SUCCESSIVE APPROXIMATION REGISTER ANALOG-TO-DIGITAL CONVERTER AND METHOD FOR OPERATING THE SAME

(71) Applicant: Industrial Technology Research Institute, Hsinchu (TW)

(72) Inventors: Yung-Hui Chung, Hsinchu (TW); Bo-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/853,873

(22) Filed: Dec. 25, 2017

(30) Foreign Application Priority Data

Oct. 24, 2017 (TW) .............................. 106136421 A

(51) Int. Cl.
*H03M 1/46* (2006.01)

(52) U.S. Cl.
CPC ........... *H03M 1/462* (2013.01); *H03M 1/468* (2013.01)

(58) Field of Classification Search
CPC ....... H03M 1/462; H03M 1/466; H03M 1/667
USPC .......................... 341/144, 155, 172, 163, 122
See application file for complete search history.

(56) References Cited

U.S. PATENT DOCUMENTS

| | | | |
|---|---|---|---|
| 8,390,501 B2 | 3/2013 | Chang et al. | |
| 9,385,740 B2 | 7/2016 | Wang et al. | |
| 2010/0079325 A1* | 4/2010 | Berens ................ | H03M 1/007 341/145 |
| 2012/0112948 A1 | 5/2012 | Le Tual et al. | |
| 2013/0015996 A1* | 1/2013 | Furuta ................ | H03M 1/06 341/172 |
| 2013/0285844 A1* | 10/2013 | Lin ..................... | H03M 1/12 341/110 |
| 2016/0254821 A1 | 9/2016 | Luo et al. | |
| 2018/0054212 A1* | 2/2018 | Funato ................ | H03M 1/06 |

FOREIGN PATENT DOCUMENTS

| | | |
|---|---|---|
| CN | 102045067 | 5/2011 |
| TW | 201412025 | 3/2014 |

OTHER PUBLICATIONS

"Office Action of Taiwan Counterpart Application", dated May 25, 2018, p. 1-p. 4.

(Continued)

*Primary Examiner* — Peguy Jean Pierre
(74) *Attorney, Agent, or Firm* — JCIPRNET

(57) ABSTRACT

A successive approximation register (SAR) analog-digital converter (ADC) and a method for operating the same are provided. The SAR ADC includes a first capacitor DAC (CDAC), a comparator and a controller. The first CDAC receives and samples an analog input signal to generate a first voltage. The comparator compares the first voltage with a comparison reference voltage to generate a first comparison result. In a k-th iteration of at least two iterations, the controller switches a k-th switching capacitor set from a first state to a second state, such that the first CDAC generates a second voltage, and the comparator compares the second voltage with the comparison reference voltage to generate a second comparison result. The controller determines a window region and determines whether the k-th switching capacitor set is switched back to the first state according to the first comparison result and the second comparison result.

16 Claims, 13 Drawing Sheets

(56) References Cited

OTHER PUBLICATIONS

Chung et al., "A 24-μW 12-b 1-MS/s SAR ADC With Two-Step Decision DAC Switching in 110-nm CMOS", IEEE Transactions on Very Large Scale Integration (VLSI) Systems, Nov. 2016, pp. 3334-3344.

Yung-Hui Chung, "The Swapping Binary-Window DAC Switching Technique for SAR ADCs", IEEE, May 2013, pp. 2231-2234.

Chun-Cheng Liu, "A 0.35mW 12b 100MS/s SAR-Assisted Digital Slope ADC in 28nm CMOS", 2016 IEEE International Solid-State Circuits Conference, Feb. 3, 2016, pp. 462-464.

Liu et al., "A 0.92mW 10-bit 50-MS/s SAR ADC in 0.13 μm CMOS Process", 2009 IEEE Symposium on VLSI Circuits, Jun. 16-18, 2009, pp. 236-237.

Liu et al., "A 1V 11fJ/Conversion-Step 10bit 10MS/s Asynchronous SAR ADC in 0.18 μm CMOS", 2010 IEEE Symposium on VLSI Circuits (VLSIC), Jun. 16-18, 2009, pp. 241-242.

\* cited by examiner

FIG. 3

SUCCESSIVE APPROXIMATION REGISTER ANALOG-TO-DIGITAL CONVERTER AND METHOD FOR OPERATING THE SAME

CROSS-REFERENCE TO RELATED APPLICATION

This application claims the priority benefit of Taiwan application serial no. 106136421, filed on Oct. 24, 2017. The entirety of the above-mentioned patent application is hereby incorporated by reference herein and made a part of this specification.

TECHNICAL FIELD

The disclosure relates to a successive approximation register analog-to-digital converter and a method for operating the same.

BACKGROUND

Along with continuous evolution of semiconductor manufacturing technology, performances of digital circuits are enhanced along with evolution of manufacturing technology. Since an improvement degree of performance of a successive approximation register analog-to-digital converter (SAR ADC) is obvious through the evolution of the manufacturing technology, researches on SAR ADC become popular in recent years. Particularly, a technology named a binary window. It can improve the integral nonlinearity (INL) of SAR ADC. In recent years, how to increase the sampling rate and improve the conversion efficiency of SAR ADC at the same time, which is one of the important problems and stand for resolving.

SUMMARY

The disclosure is directed to a successive approximation register analog-to-digital converter (SAR ADC) and a method for operating the same.

One embodiment of the disclosure provides a SAR ADC configured to convert a first analog input signal into a digital output signal. The SAR ADC includes a first capacitor digital-to-analog converter (CDAC), a comparator and a controller. The first CDAC is configured to receive and sample the first analog input signal to generate a first voltage. The comparator is coupled to the first CDAC to receive the first voltage, and compares the first voltage with a comparison reference voltage to generate a first comparison result. The controller is coupled to the comparator and the first CDAC, and is configured to determine switching operations of a plurality of switching capacitor sets of the first CDAC according to the first comparison result. In a k-th iteration of at least two of a plurality of iterations, the controller switches a k-th switching capacitor set in the switching capacitor sets from a first state to a second state, such that the first CDAC generates a second voltage, and the comparator compares the second voltage with the comparison reference voltage to generate a second comparison result, where k is a positive integer. The controller determines a window region and determines whether to switch the k-th switching capacitor set back to the first state according to the first comparison result and the second comparison result.

One embodiment of the disclosure provides a SAR ADC configured to convert a first analog input signal into a digital output signal. The SAR ADC includes a first capacitor DAC (CDAC), a comparator and a controller. The first CDAC is configured to receive and sample the first analog input signal, and is controlled by a plurality of first control signals to respectively control switching operations of a plurality of switching capacitor sets of the first CDAC. The comparator is coupled to the first CDAC, and compares an output of the first CDAC with a comparison reference voltage. The controller is coupled to the comparator and the first CDAC, and is configured to generate the first control signals and the digital output signal according to an output of the comparator. The controller approximates the output of the first CDAC to an M-bit window according to the output of the comparator, and the controller completes an operation of approximating the output of the first CDAC to the M-bit window according to results of (M+1) comparison operations of the comparator, where M is a positive integer.

One embodiment of the disclosure provides a method for operating a SAR ADC, which is adapted to convert a first analog input signal into a digital output signal. The method for operating the SAR ADC includes: receiving and sampling the first analog input signal by a first CDAC to generate a first voltage; comparing the first voltage with a comparison reference voltage by a comparator to generate a first comparison result; determining switching operations of a plurality of switching capacitor sets of the first CDAC by a controller according to the first comparison result; in a k-th iteration of at least two of a plurality of iterations, switching a k-th switching capacitor set in the switching capacitor sets from a first state to a second state by the controller, such that the first CDAC generates a second voltage, and comparing the second voltage with the comparison reference voltage by the comparator to obtain a second comparison result, where k is a positive integer; and determining a window region and determining whether to switch the k-th switching capacitor set back to the first state by the controller according to the first comparison result and the second comparison result.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3 is a schematic diagram of a coding operation according to an embodiment of the disclosure.

DESCRIPTION OF EMBODIMENTS

Figure 1:
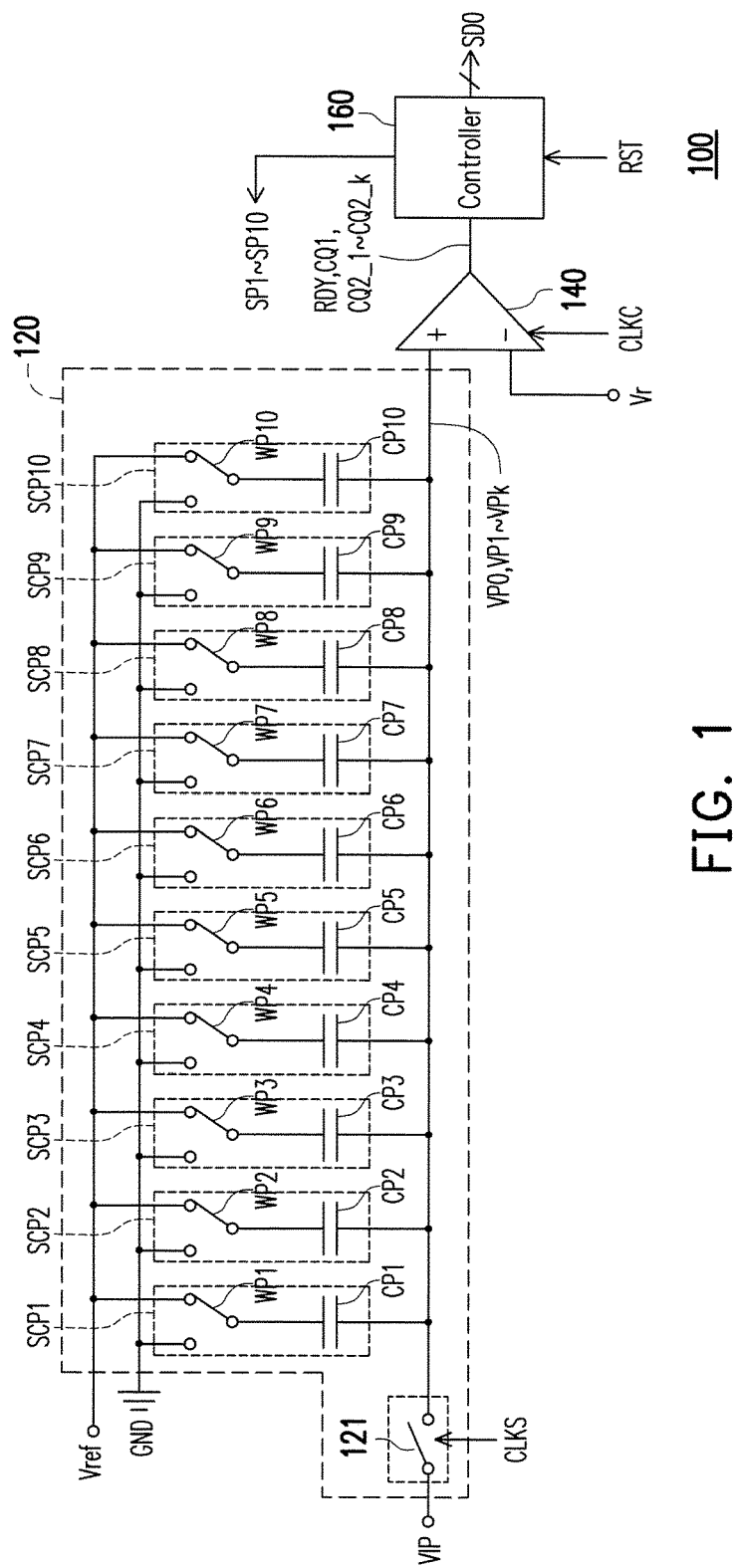
FIG. 1 is a circuit block schematic diagram of a successive approximation register analog-to-digital converter (SAR ADC) according to an embodiment of the disclosure.

Reference will now be made in detail to the present preferred embodiments of the disclosure, examples of which are illustrated in the accompanying drawings. Wherever possible, the same reference numbers are used in the drawings and the description to refer to the same or like parts.

Referring to FIG. 1, FIG. 1 is a circuit block schematic diagram of a successive approximation register analog-to-digital converter (SAR ADC) according to an embodiment of the disclosure. The SAR ADC 100 is a single-ended input type analog-to-digital converter (ADC). The SAR ADC 100 is configured to convert a first analog input signal VIP into a digital output signal SDO, where the digital output signal SDO has N bits calculated from the most significant bit (MSB) to the least significant bit (LSB), where N is a positive integer. For simplicity's sake, it is assumed that N is 10 as an example, and the other embodiments where N is other positive integers may be deduce by analogy.

The SAR ADC 100 may include a first capacitor digital-to-analog converter (CDAC) 120, a comparator 140 (a single comparator) and a controller 160. The first CDAC 120 may include a sampling switch 121 and switching capacitor sets SCP1-SCP10. Each of the switching capacitor sets SCP1-SCP10 is respectively controlled by first control signals SP1-SP10. The first CDAC 120 may receive and sample the first analog input signal VIP through the sampling switch 121 at a time point to generate a first voltage VP0. The sampling switch 121 is, for example, a bootstrapped switch controlled by a sampling clock signal CLKS. The first CDAC 120 is controlled by a plurality of the first control signals SP1-SP10 to respectively control switching operations of the switching capacitor sets SCP1-SCP10. In detail, a switching capacitor set SCPi may include a capacitor CPi and a switch WPi, where i is an integer from 1 to L, and in the present embodiment, L is equal to 10. First ends of the capacitors CP1-CP10 are coupled to a non-inverting input terminal of the comparator 140, and second ends of the capacitors CP1-CP10 are switched between a first reference voltage Vref and a ground voltage GND through the corresponding switches WP1-WP10. The switches WP1-WP10 are respectively controlled by the first control signals SP1-SP10. Capacitances of the capacitors CP1-CP8 are respectively twice of the capacitances of the capacitors CP2-CP9, and the capacitance of the capacitor CP9 is equal to a capacitance of the capacitor CP10.

The comparator 140 receives the first voltage VP0 from the first CDAC 120, and is controlled by a comparison clock signal CLKC to compare the first voltage VP0 with a comparison reference voltage Vr to generate a first comparison result CQ1, where the comparison reference voltage Vr is, for example, the first reference voltage Vref. The controller 160 is coupled to the comparator 140 and the first CDAC 120. Particularly, the controller 160 may generate the first control signals SP1-SP10 according to the first comparison result CQ1, so as to respectively control the switching operations of the switching capacitor sets SCP1-SCP10.

Further, the controller 160 has a binary window function. The controller 160 may determine the switching operation of at least one of the switching capacitor sets SCP1-SCP10 according to the output (i.e. the first comparison result CQ1) of the comparator 140, so as to approximate the output of the first CDAC 120 to the aforementioned binary window, where the above binary window is an M-bit window, and M is a positive integer smaller than or equal to N. In detail, in a k-th iteration of M iterations (k is smaller than or equal to M) of the SAR ADC 100, the controller 160 switches a k-th switching capacitor set SCPk in the switching capacitor sets SCP1-SCP10 (for example, from a first state to a second state), such that the first CDAC 120 generates a corresponding second voltage VPk. Then, the comparator 140 compares the second voltage VPk of the k-th iteration with the comparison reference voltage Vr to generate a corresponding second comparison result $CQ2\_k$. The controller 160 may define (or determine) a window region WINk according to the first comparison result CQ1 and the second comparison result $CQ2\_k$. Moreover, the controller 160 may determine to switch the k-th switching capacitor set SCPk back to the first state or maintain the k-th switching capacitor set SCPk at the second state according to the first comparison result CQ1 and the second comparison result $CQ2\_k$.

In the k-th iteration, if the first comparison result CQ1 represents that the first voltage VP0 is greater than the comparison reference voltage Vr, and the second comparison result $CQ2\_k$ represents that the second voltage VPk is also greater than the comparison reference voltage Vr, the controller 160 maintains the k-th switching capacitor set at the second state (i.e. the state after the switching). Alternatively, in the k-th iteration, if the first comparison result CQ1 represents that the first voltage VP0 is smaller than the comparison reference voltage Vr, and the second comparison result $CQ2\_k$ represents that the second voltage VPk is also smaller than the comparison reference voltage Vr, the controller 160 maintains the k-th switching capacitor set at the second state (i.e. the state after the switching).

Comparatively, in the k-th iteration, if the first comparison result CQ1 and the second comparison result $CQ2\_k$ represent that one of the first voltage VP0 and the second voltage VPk is greater than the comparison reference voltage Vr, and the other one of the first voltage VP0 and the second voltage VPk is smaller than the comparison reference voltage Vr, the controller 160 switches the k-th switching capacitor set back to the first state (i.e. the state before the switching).

Figure 2:
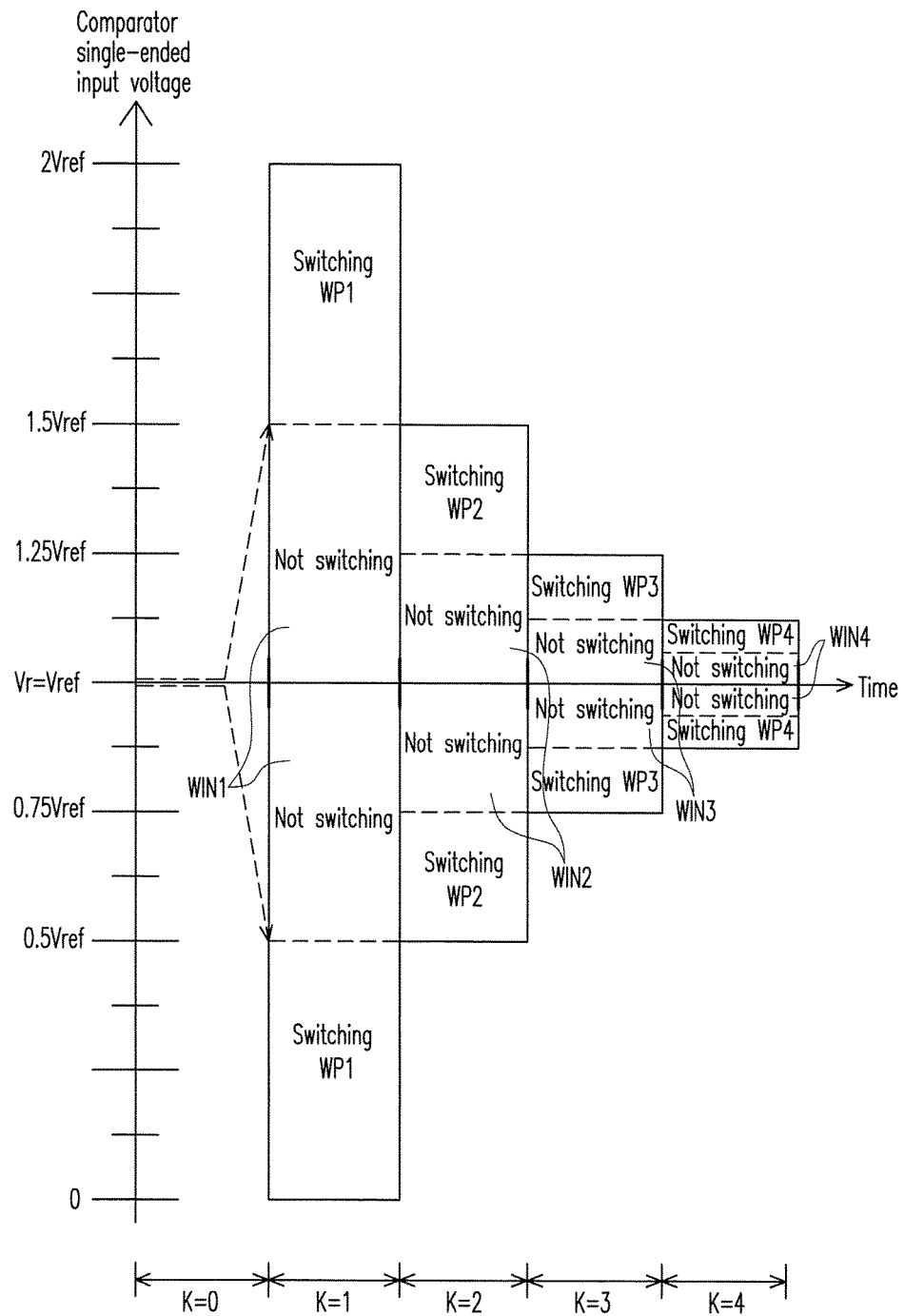
FIG. 2 is a schematic diagram of a switching mechanism of a single-ended input type SAR ADC executing a binary window function according to an embodiment of the disclosure.

Referring to FIG. 1 and FIG. 2 together, FIG. 2 is a schematic diagram of a switching mechanism of a single-ended input type SAR ADC executing the binary window function according to an embodiment of the disclosure, in which a horizontal axis represents time, and a vertical axis represents output voltages of the first CDAC 120 (i.e.

single-ended input voltages of the comparator 140). For simplicity's sake, it is assumed that M is equal to 4 (i.e. the binary window is 4-bit window) as an example, and the embodiments where M is other positive integers may be deduced by analogy. Based on the fact that the binary window is the 4-bit window, four window regions, i.e. WIN1-WIN4 encircled by dot lines are respectively indicated in a first iteration (i.e. k=1) to a fourth iteration (i.e. k=4) as shown in FIG. 2.

First, in a sample-and-hold operation (i.e. k=0), the first CDAC 120 receives and samples the first analog input signal VIP through the sampling switch 121 to generate a first voltage VP0. It should be noted that amplitude of the first analog input signal VIP is, for example, equal to the first reference voltage Vref, and a common mode voltage of the first analog input signal VIP is, for example, equal to the first reference voltage Vref. The comparator 140 may determine whether the first voltage VP0 is greater than the comparison reference voltage Vr, so as to generate the first comparison result CQ1. Then, in the first iteration (i.e. k=1), the controller 160 may generate the first control signal SP1 according to the first comparison result CQ1 to control the switching operation of the switching capacitor set SCP1. The situation that the first voltage VP0 is greater than the comparison reference voltage Vr is described below.

In the sample-and-hold operation (i.e. k=0), if the first voltage VP0 is greater than the comparison reference voltage Vr, the comparator 140 may output the first comparison result CQ1 which is, for example, logic 1. Therefore, in the first iteration (i.e. k=1), the controller 160 switches the switch WP1 in the switching capacitor set SCP1 to decrease the first voltage VP0, such that the first CDAC 120 generates the corresponding second voltage VP1, where VP1=VP0−(Vref/$2^k$)=VP0−(Vref/2)=VP0−(Vr/2). It should be noted that the first reference voltage Vref, in this embodiment, is the comparison reference voltage Vr, so that in the following description, it is assumed that Vref=Vr. Then, the comparator 140 may compare the second voltage VP1 of the first iteration (i.e. k=1) with the comparison reference voltage Vr to determine whether the second voltage VP1 is greater than the comparison reference voltage Vr. If the second voltage VP1 is greater than the comparison reference voltage Vr, the comparator 140 outputs the second comparison result CQ2_1 which is, for example, the logic 1. It should be noted that if the second voltage VP1 is greater than the comparison reference voltage Vr, it represents that the first voltage VP0 is greater than 1.5 Vref and is located outside the window region WIN1, and the controller 160 maintains the switch WP1 of the switching capacitor set SCP1 at the state after the switching (i.e. the second state), and now VP1=VP0−(Vr/2). Comparatively, if the second voltage VP1 is smaller than the comparison reference voltage Vr, the comparator 140 outputs the second comparison result CQ2_1 which is, for example, logic 0. It should be noted that if the second voltage VP1 is smaller than the comparison reference voltage Vr, it represents that the first voltage VP0 is smaller than 1.5 Vref and is located inside the window region WIN1, and the controller 160 switches the switch WP1 of the switching capacitor set SCP1 back to the state before the switching (i.e. the first state), and now VP1=VP0.

Then, in the second iteration (i.e. k=2), the controller 160 switches the switch WP2 of the switching capacitor set SCP2 to decrease the second voltage VP1, such that the first CDAC 120 generates the corresponding second voltage VP2, where VP2=VP1−(Vr/$2^k$)=VP1−(Vr/4). Then, the comparator 140 may compare the second voltage VP2 of the second iteration (i.e. k=2) with the comparison reference voltage Vr to determine whether the second voltage VP2 is greater than the comparison reference voltage Vr. If the second voltage VP2 is greater than the comparison reference voltage Vr, the comparator 140 outputs a second comparison result CQ2_2 which is, for example, the logic 1. It should be noted that if the second voltage VP2 is greater than the comparison reference voltage Vr, it represents that the second voltage VP1 is greater than 1.25 Vref and is located outside the window region WIN2, and the controller 160 maintains the switch WP2 of the switching capacitor set SCP2 at the state after the switching (i.e. the second state), and now VP2=VP1−(Vr/4). Comparatively, if the second voltage VP2 is smaller than the comparison reference voltage Vr, the comparator 140 outputs the second comparison result CQ2_2 which is, for example, the logic 0. It should be noted that if the second voltage VP2 is smaller than the comparison reference voltage Vr, it represents that the second voltage VP1 is smaller than 1.25 Vref and is located inside the window region WIN2, and the controller 160 switches the switch WP2 of the switching capacitor set SCP2 back to the state before the switching (i.e. the first state), and now VP2=VP1. It should be noted that the second voltage VP1 is determined according to a result (i.e. the second comparison result CQ2_1) of the first iteration (i.e. k=1), and if the second comparison result CQ2_1 is, for example, the logic 1, VP1=VP0−(Vr/2); and if the second comparison result CQ2_1 is, for example, the logic 0, VP1=VP0.

The third iteration (i.e. k=3) and the fourth iteration (i.e. k=4) of the SAR ADC 100 may be deduced according to the related descriptions of the first iteration (i.e. k=1) and the second iteration (i.e. k=2), and details thereof are not repeated.

The situation that the first voltage VP0 is smaller than the comparison reference voltage Vr is described below. In the sample-and-hold operation (i.e. k=0), if the first voltage VP0 is smaller than the comparison reference voltage Vr, the comparator 140 may output the first comparison result CQ1 which is, for example, the logic 0. Therefore, in the first iteration (i.e. k=1), the controller 160 switches the switch WP1 in the switching capacitor set SCP1 to increase the first voltage VP0, such that the first CDAC 120 generates the corresponding second voltage VP1, where VP1=VP0+(Vr/$2^k$)=VP0+(Vr/2). Then, the comparator 140 may compare the second voltage VP1 of the first iteration (i.e. k=1) with the comparison reference voltage Vr to determine whether the second voltage VP1 is greater than the comparison reference voltage Vr. If the second voltage VP1 is greater than the comparison reference voltage Vr, the comparator 140 outputs the second comparison result CQ2_1 which is, for example, the logic 1. It should be noted that if the second voltage VP1 is greater than the comparison reference voltage Vr, it represents that the first voltage VP0 is greater than 0.5 Vref and is located inside the window region WIN1, and the controller 160 switches the switch WP1 of the switching capacitor set SCP1 back to the state before the switching (i.e. the first state), and now VP1=VP0. Comparatively, if the second voltage VP1 is smaller than the comparison reference voltage Vr, the comparator 140 outputs the second comparison result CQ2_1 which is, for example, logic 0. It should be noted that if the second voltage VP1 is smaller than the comparison reference voltage Vr, it represents that the first voltage VP0 is smaller than 0.5 Vref and is located outside the window region WIN1, and the controller 160 maintains the switch WP1 of the switching capacitor set SCP1 at the state after the switching (i.e. the second state), and now VP1=VP0+(Vr/2).

Then, in the second iteration (i.e. k=2), the controller 160 switches the switch WP2 in the switching capacitor set SCP2 to increase the second voltage VP1, such that the first CDAC 120 generates the corresponding second voltage VP2, where VP2=VP1+(Vr/$2^k$)=VP1+(Vr/4). Then, the comparator 140 may compare the second voltage VP2 of the second iteration (i.e. k=2) with the comparison reference voltage Vr to determine whether the second voltage VP2 is greater than the comparison reference voltage Vr. If the second voltage VP2 is greater than the comparison reference voltage Vr, the comparator 140 outputs the second comparison result CQ2_2 which is, for example, the logic 1. It should be noted that if the second voltage VP2 is greater than the comparison reference voltage Vr, it represents that the second voltage VP1 is greater than 0.75 Vref and is located inside the window region WIN2, and the controller 160 switches the switch WP2 of the switching capacitor set SCP2 back to the state before the switching (i.e. the first state), and now VP2=VP1. Comparatively, if the second voltage VP2 is smaller than the comparison reference voltage Vr, the comparator 140 outputs the second comparison result CQ2_2 which is, for example, the logic 0. It should be noted that if the second voltage VP2 is smaller than the comparison reference voltage Vr, it represents that the second voltage VP1 is smaller than 0.75 Vref and is located outside the window region WIN2, and the controller 160 maintains the switch WP2 of the switching capacitor set SCP2 at the state after the switching (i.e. the second state), and now VP2=VP1+(Vr/4). It should be noted that the second voltage VP1 is determined according to a result (i.e. the second comparison result CQ2_1) of the first iteration (i.e. k=1), and if the second comparison result CQ2_1 is, for example, the logic 1, VP1=VP0; and if the second comparison result CQ2_1 is, for example, the logic 0, VP1=VP0+(Vr/2).

The third iteration (i.e. k=3) and the fourth iteration (i.e. k=4) of the SAR ADC 100 may be deduced according to the related descriptions of the first iteration (i.e. k=1) and the second iteration (i.e. k=2), and details thereof are not repeated.

According to the above description, it is known that the controller 160 may complete the operation of approximating the output of the first CDAC 120 to the M-bit window according to the result (for example, the aforementioned first comparison result and the second comparison result) of (M+1) comparison operations of the comparator 140.

The following table 1 lists permutations and combinations of various comparison results, the corresponding codings and whether the switches of the switching capacitor sets are finally switched when the SAR ADC 100 executes the binary window function. In detail, a code dk may have a bit dk1 and a bit dk2, where bit values of the bit dk1 and the bit dk2 may be determined according to the first comparison result CQ1 and the second comparison result CQ2_k. For example, if the first comparison result CQ1 is the logic 1 and the second comparison result CQ2_k is the logic 1, the bit value of the bit dk1 is 1 and the bit value of the bit dk2 is 0, and a coding result of the code dk is (1,0). If the first comparison result CQ1 is the logic 1 and the second comparison result CQ2_k is the logic 0, the bit value of the bit dk1 is 0 and the bit value of the bit dk2 is 1, and the coding result of the code dk is (0,1). If the first comparison result CQ1 is the logic 0 and the second comparison result CQ2_k is the logic 1, the bit value of the bit dk1 is 0 and the bit value of the bit dk2 is 1, and the coding result of the code dk is (0,1). If the first comparison result CQ1 is the logic 0 and the second comparison result CQ2_k is the logic 0, the bit value of the bit dk1 is 0 and the bit value of the bit dk2 is 0, and the coding result of the code dk is (0,0).

TABLE 1

| First comparison result CQ1 | Second comparison result CQ2_k (k = 1, 2, 3, 4) | Code dk = (dk1, dk2) (k = 1, 2, 3, 4) | Switch WPk (k = 1, 2, 3, 4) |
|---|---|---|---|
| 1 | 1 | (1, 0) | switching |
| 1 | 0 | (0, 1) | No switching |
| 0 | 1 | (0, 1) | No switching |
| 0 | 0 | (0, 0) | switching |

After the SAR ADC 100 executes the binary window function shown in FIG. 2, in the fifth iteration (i.e. k=5) to the tenth iteration (i.e. k=10), the SAR ADC 100, for example, adopts a binary successive approximation algorithm without the window function to sequentially switch the switches WP5-WP10 of the switching capacitor sets SCP5-SCP10, so as to sequentially obtain the corresponding second comparison results CQ2_5-CQ2_10, and after the aforementioned tenth iteration is ended, the controller 160 may perform a coding operation according to the first comparison result CQ1 of the sample-and-hold operation and the second comparison results CQ2_1-CQ2_10 of the above iterations, so as generate the digital output signal SDO corresponding to the analog input signal VIP. For example, in an adding operation shown in FIG. 3, the coded bits d11, d12, d21, d22, d31, d32, d41, d42 may be correspondingly obtained according to the first comparison result CQ1 and the second comparison results CQ2_1-CQ2_4 of the table 1, and binary codes B1-B10 are 10 bits of the digital output signal SDO, where the binary code B1 is the most significant bit, and the binary code B10 is the least significant bit.

Figure 3:
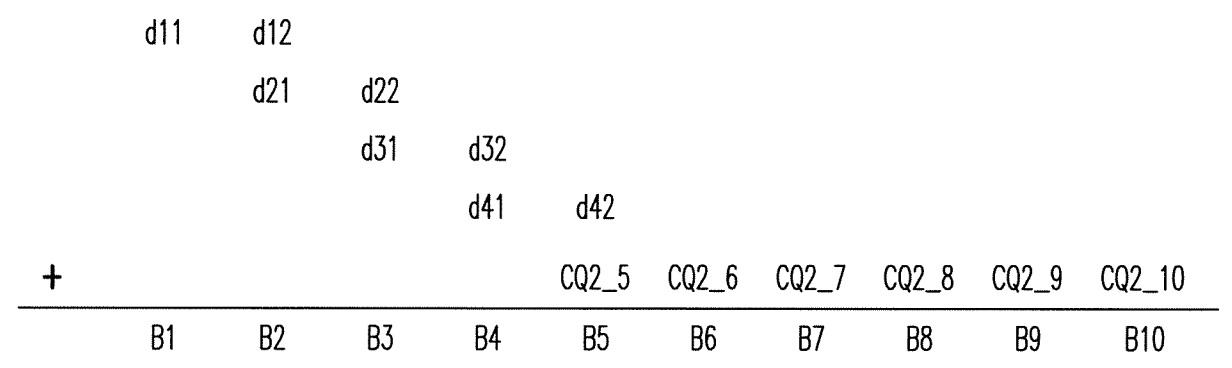

In detail, the adding operation shown in FIG. 3 may be implemented by an adder, where the binary codes B6-B10 are respectively the second comparison results CQ2_6-CQ2_10. Moreover, a first stage adder (which may be a full adder) may be adopted to add the bit d42 and the second comparison result CQ2_5 to generate an output sum (i.e. the binary code B5) and a first output carry. Then, a second stage adder (which may be a full adder) may be adopted to add the bit d32, the bit d41 and the first output carry to generate an output sum (i.e. the binary code B4) and a second output carry. Afterward, a third stage adder (which may be a full adder) may be adopted to add the bit d22, the bit d31 and the second output carry to generate an output sum (i.e. the binary code B3) and a third output carry. A calculation method of the binary codes B2 and B1 may be deduced by analogy according to the related description of the aforementioned binary code B3 or B4, and detail thereof is not repeated.

In an embodiment of the disclosure, the controller 160 may be implemented by hardware, firmware or software or machine executable program codes stored in a memory and loaded and executed by a microprocessor or a digital signal processor. If the controller 160 is implemented by hardware, the controller 160 may be implemented by a single integrated circuit chip, or implemented by a plurality of circuit chips, though the disclosure is not limited thereto. The plurality of circuit chips or the single integrated circuit chip may be implemented by an application specific integrated circuit (ASIC) or a field programmable gate array (FPGA). The aforementioned memory is, for example, a random access memory, a read-only memory or a flash memory, etc.

Figure 4A:
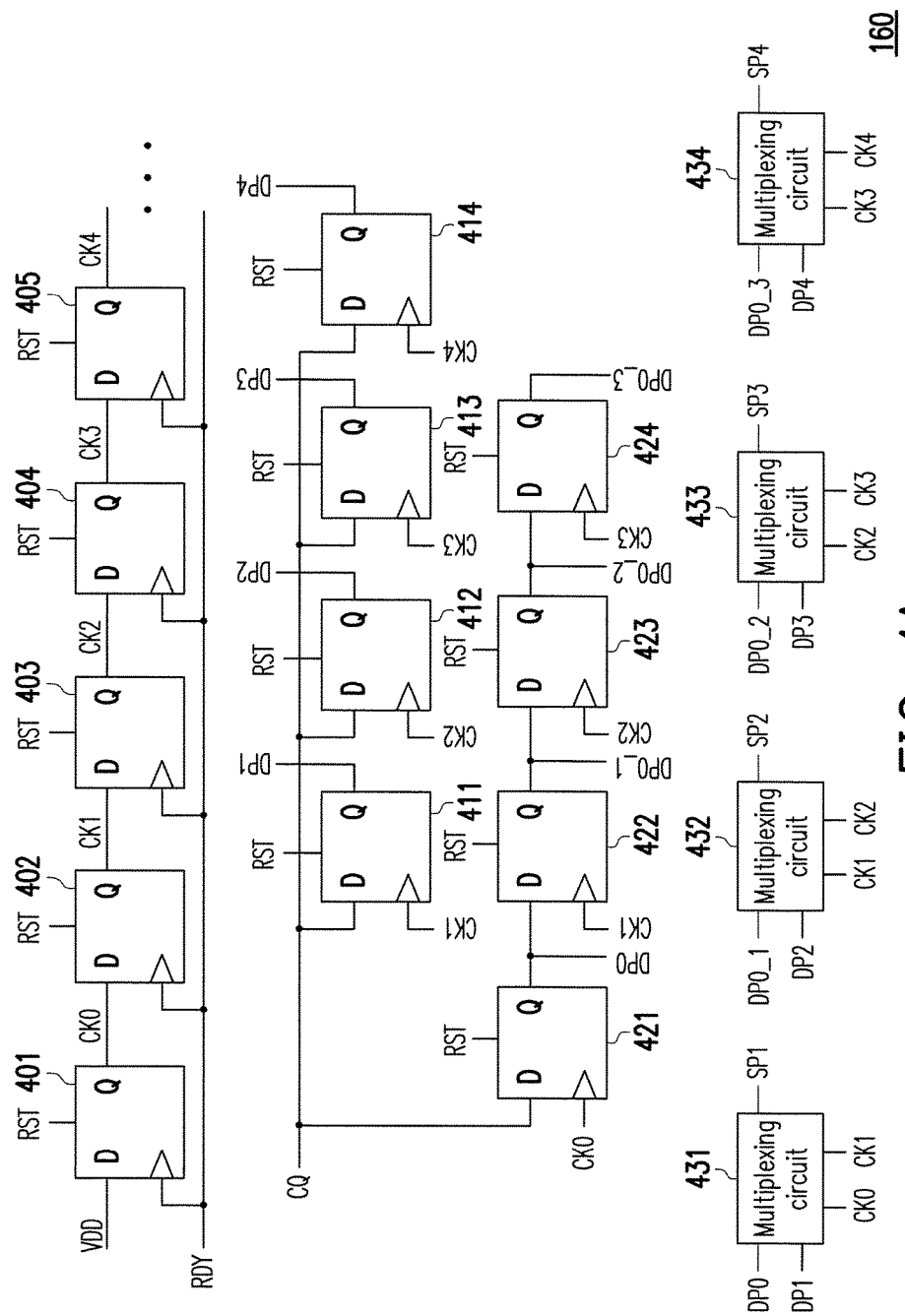
FIG. 4A is a schematic diagram of a part of a circuit structure of a controller according to an embodiment of the disclosure.
Figure 4B:
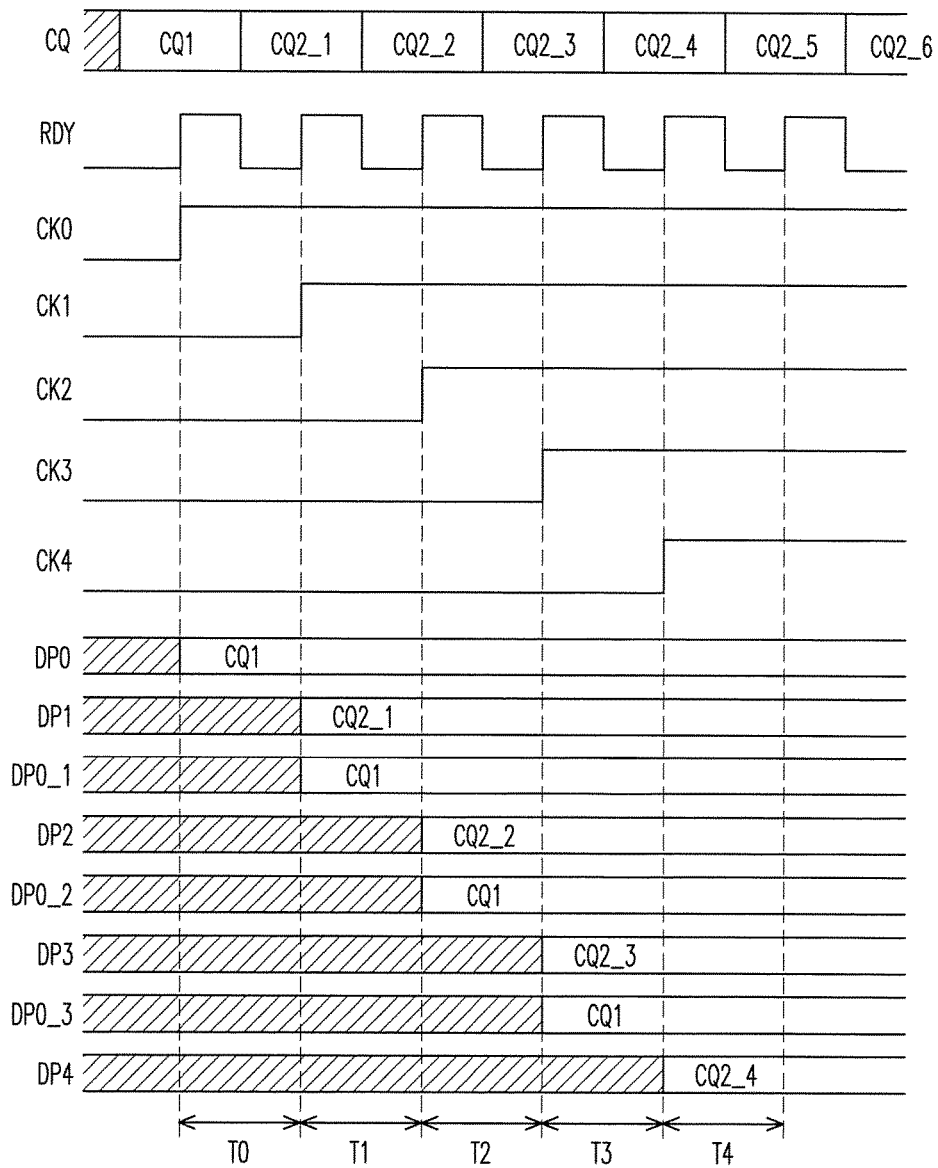
FIG. 4B is a schematic diagram of signal timing of the controller of FIG. 4A.

Referring to FIG. 1, FIG. 2, FIG. 4A and FIG. 4B, FIG. 4A is a schematic diagram of a part of a circuit structure of the controller 160 according to an embodiment of the disclosure, which is used for implementing a 4-bit binary window function, and FIG. 4B is a schematic diagram of signal timing of the controller 160 of FIG. 4A. First, the controller 160 may receive a reset signal RST, and all of related logical circuits of the control 160 are reset according to the reset signal RST. Then, the controller 160 may receive a ready signal RDY and a comparison result CQ (including the first comparison result CQ1 and the second comparison result CQ2_1-CQ2_4) from the comparator 140, where the ready signal RDY is used for indicating that the comparison result CQ is ready. The controller 160 includes shift registers 401-405, first registers 411-414, second registers 421-424 and multiplexing circuits 431-434.

Reset terminals of the shift registers 401-405 receive the reset signal RST. Clock terminals of the shift registers 401-405 receive the ready signal RDY. An input terminal D of the first stage shift register 401 receives the power voltage VDD. An output terminal Q of each stage shift register (for example, the first stage shift register 401) in the shift registers 401-405 is coupled to the input terminal D of the next stage shift register (for example, the shift register 402). The shift registers 401-405 may be triggered by the ready signal RDY to sequentially generate signals CK0-CK4 shown in FIG. 4B.

Reset terminals of the first registers 411-414 receive the reset signal RST. Clock terminals of the first registers 411-414 respectively receive the signals CK1-CK4. Input terminals D of the first register 411-414 and the second register 421 are coupled to a comparison result input terminal CQ of the controller 160 to receive the first comparison result CQ1 and the second comparison results CQ2_1-CQ2_4. The first registers 411-414 may be respectively triggered by the signals CK1-CK4 to respectively latch the corresponding second comparison results CQ2_1-CQ2_4, shown as signals DP1-DP4 of FIG. 4B. Reset terminals of the second registers 421-424 receive the reset signal RST. Clock terminals of the second registers 421-424 respectively receive the signals CK0-CK3. The second registers 421-424 may be respectively triggered by the signals CK0-CK3 to sequentially latch the first comparison result CQ1, shown as signals DP0, DP0_1, DP0_2, DP0_3 of FIG. 4B.

The multiplexing circuit 431 may be triggered by the CK0 to take the signal DP0 as the first control signal SP1, and may be triggered by the CK1 to take the signal DP1 as the first control signal SP1. The multiplexing circuit 432 may be triggered by the signal CK1 to take the signal DP0_1 as the first control signal SP2, and may be triggered by the signal CK2 to take the signal DP2 as the first control signal SP2. Operations of the multiplexing circuits 433 and 434 may be deduced by analogy.

First, in a time section T0, it is assumed that the first comparison result CQ1 on the signal DP0 is the logic 1 (which represents that the first voltage VP0 is greater than the comparison reference voltage Vr), the first control signal SP1 output by the multiplexing circuit 431 is the logic 1, such that the switch WP1 in the switching capacitor set SCP1 is switched to decrease the first voltage VP0 (a decreased amplitude thereof is (Vr/2)).

In a time section T1, if the second comparison result CQ2_1 on the signal DP1 is also the logic 1 (which represents that the first voltage VP0 is located outside the window region WIN1 of FIG. 2), the first control signal SP1 output by the multiplexing circuit 431 is the logic 1, and the switch WP1 in the switching capacitor set SCP1 is maintained at the state after the switching. Comparatively, in the time section T1, if the second comparison result CQ2_1 on the signal DP1 is the logic 0 (which represents that the first voltage VP0 is located inside the window region WIN1 of FIG. 2), the first control signal SP1 output by the multiplexing circuit 431 is the logic 0, and the switch WP1 in the switching capacitor set SCP1 is switched back to the state before the switching.

Meanwhile, in the time section T1, since the first comparison result CQ1 on the signal DP0_1 is the logic 1, the first control signal SP2 output by the multiplexing circuit 432 is the logic 1, and the switch WP2 in the switching capacitor set SCP2 is switched to decrease the second voltage VP1 (a decreased amplitude thereof is (Vr/4)).

In a time section T2, if the second comparison result CQ2_2 on the signal DP2 is also the logic 1 (which represents that the second voltage VP1 is located outside the window region WIN2 of FIG. 2), the first control signal SP2 output by the multiplexing circuit 432 is the logic 1, and the switch WP2 in the switching capacitor set SCP2 is maintained at the state after the switching. Comparatively, in the time section T2, if the second comparison result CQ2_2 on the signal DP2 is the logic 0 (which represents that the second voltage VP1 is located inside the window region WIN2 of FIG. 2), the first control signal SP2 output by the multiplexing circuit 432 is the logic 0, and the switch WP2 in the switching capacitor set SCP2 is switched back to the state before the switching. Operations in time section T3 and T4 and operations of the multiplexing circuits 433 and 434 may be deduced by analogy, and details thereof are not repeated.

Figure 5:
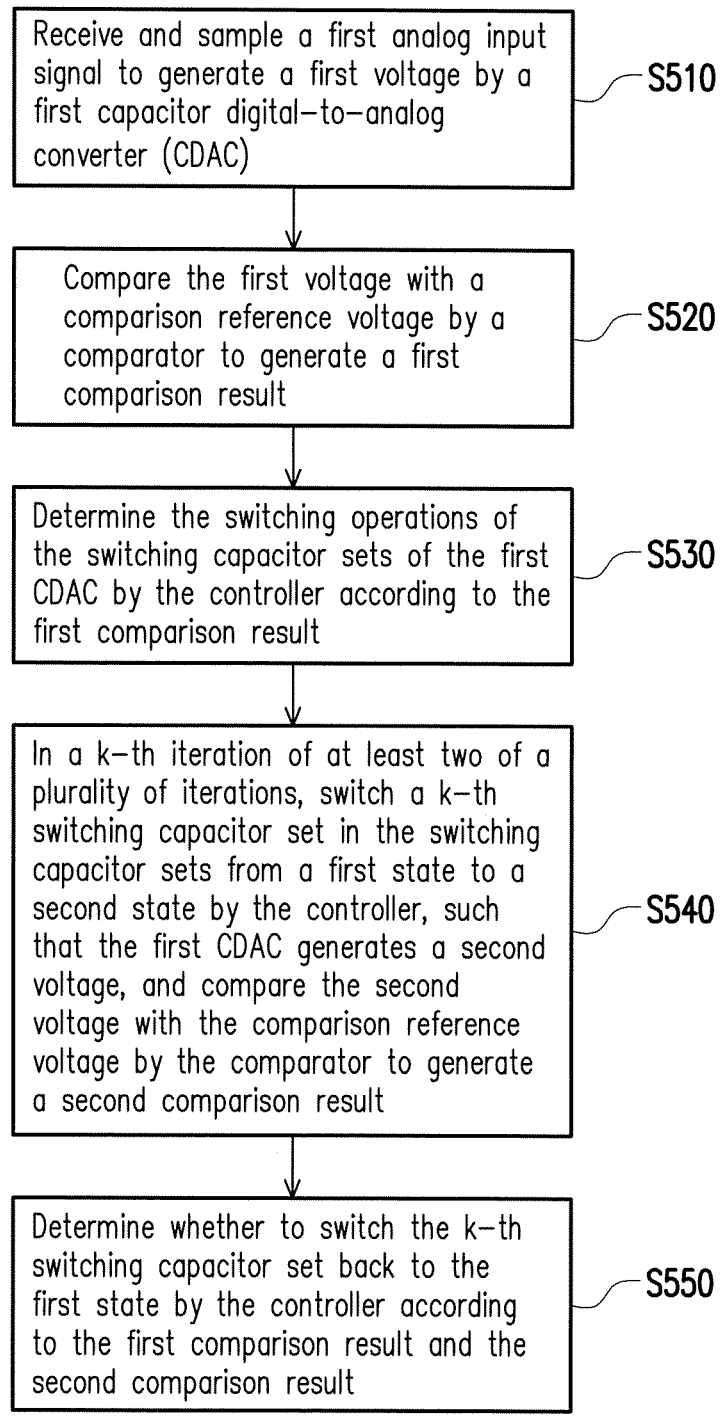
FIG. 5 is a flowchart illustrating a method for operating a SAR ADC according to an embodiment of the disclosure.

FIG. 5 is a flowchart illustrating a method for operating a SAR ADC according to an embodiment of the disclosure, which is used for executing an M-bit window function. Referring to FIG. 1 and FIG. 5 together, after the SAR ADC 100 starts to operate, in step S510, the first CDAC 120 is applied to receive and sample the first analog input signal VIP to generate the first voltage VP0. Then, in step S520, the comparator 140 is applied to compare the first voltage VP0 with the comparison reference voltage Vr to generate the first comparison result CQ1. Then, in step S530, the controller 160 is applied to determine the switching operations of the switching capacitor sets SCP1-SCP10 of the first CDAC 120 according to the first comparison result CQ1. Then, in a k-th iteration of at least two of a plurality of iterations, the controller 160 is applied to switch a k-th switching capacitor set in the switching capacitor sets SCP1-SCP10 of the first CDAC 120 from a first state to a second state, such that the first CDAC 120 generates the second voltage VPk, and the comparator 140 is applied to compare the second voltage VPk with the comparison reference voltage Vr to obtain a second comparison result CQ2_k, as shown in step S540. Then, in step S550, the controller 160 is applied to determine whether to switch the k-th switching capacitor set back to the first state according to the first comparison result CQ1 and the second comparison result CQ2_k.

Figure 6:
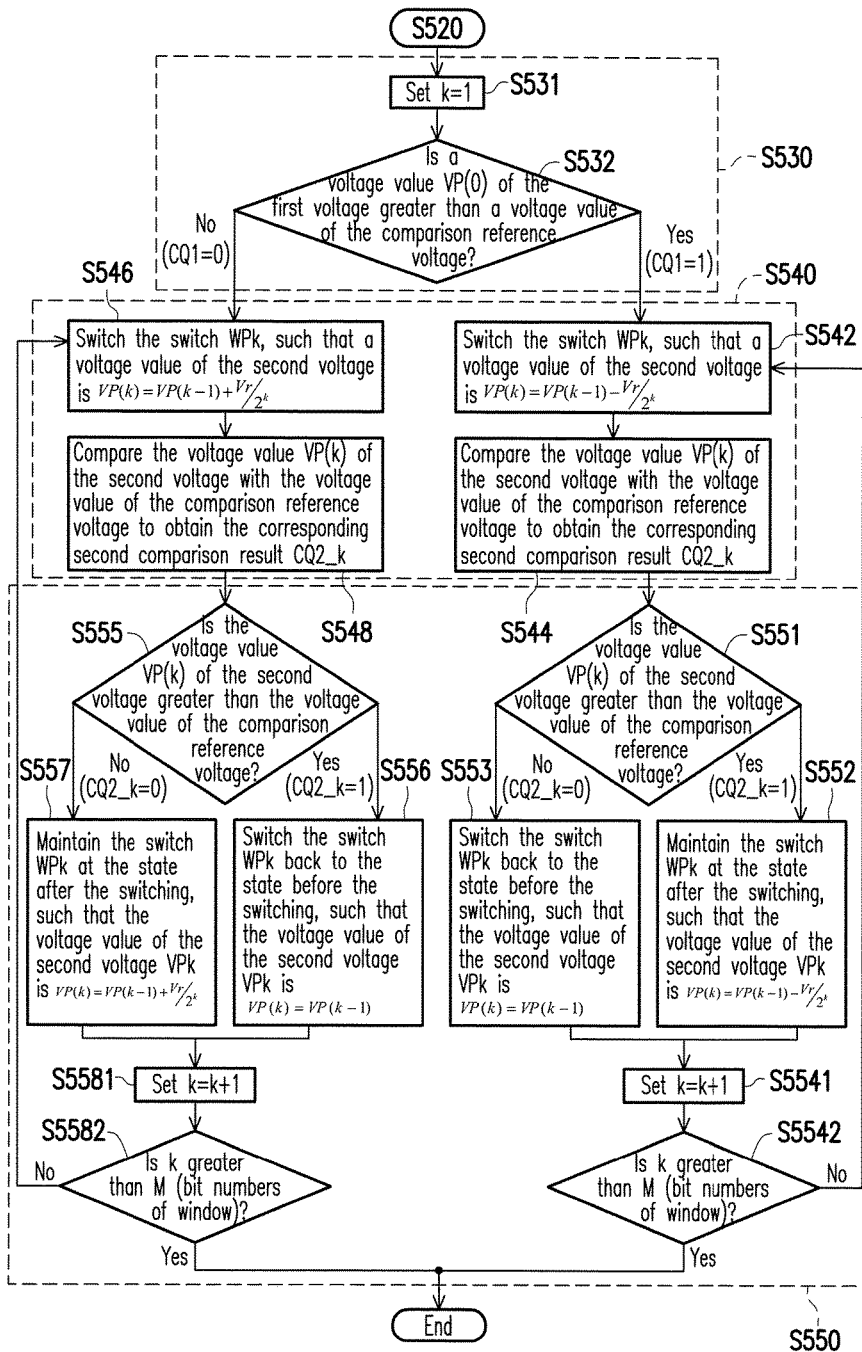
FIG. 6 is a flowchart illustrating detailed steps of steps S530, S540 and S550 of FIG. 5 according to an embodiment of the disclosure.

Referring to FIG. 5 and FIG. 6 together, FIG. 6 is a flowchart illustrating detailed steps of the steps S530, S540 and S550 of FIG. 5 according to an embodiment of the disclosure. First, in step S531, the controller 160 sets k to 1. Then, in step S532, the controller 160 determines whether a voltage value VP(0) of the first voltage VP0 is greater than a voltage value of the comparison reference voltage Vr according to the first comparison result CQ1, so as to start the iterations.

If the determination result of the step S532 is affirmative (for example, the first comparison result CQ1 is the logic 1), a step S542 is executed, by which the controller 160 is applied to switch the switch WPk of the switching capacitor set SCPk, such that the first CDAC 120 generates the decreased second voltage VPk, and a voltage value VP(k) thereof is shown as a following equation (1):

$$VP(k)=VP(k-1)-Vr/2^k \qquad \text{equation (1)}$$

Then, in step S544, the comparator 140 is applied to compare the voltage value VP(k) of the second voltage VPk with the voltage value of the comparison reference voltage Vr to obtain the corresponding second comparison result CQ2_k. Thereafter, in step S551, the controller 160 determines whether the voltage value VP(k) of the second voltage VPk is greater than the voltage value of the comparison reference voltage Vr according to the second comparison result CQ2_k. If the determination result of the step S551 is affirmative (for example, the second comparison result CQ2_k is the logic 1), a step S552 is executed, by which the controller 160 is applied to maintain the switch WPk of the switching capacitor set SCPk at the state after the switching, such that the voltage value VP(k) of the second voltage VPk output by the first CDAC 120 is shown as the equation (1). If the determination result of the step S551 is negative (for example, the second comparison result CQ2_k is the logic 0), a step S553 is executed, by which the controller 160 is applied to switch the switch WPk of the switching capacitor set SCPk back to the state before the switching, such that the voltage value VP(k) of the second voltage VPk output by the first CDAC 120 is shown as a following equation (2).

$$VP(k)=VP(k-1) \qquad (2)$$

In step S5541, the controller 160 may set k=k+1, and in step S5542, it is determined whether k is greater than M (i.e. bit numbers of the window). If the determination result of the step S5542 is negative, the step S542 is returned to perform a next iteration. If the determination result of the step S5542 is affirmative, it represents that the SAR ADC 100 has completed the M-bit window operation.

On the other hand, if the determination result of the step S532 is negative (for example, the first comparison result CQ1 is the logic 0), a step S546 is executed, by which the controller 160 is applied to switch the switch WPk of the switching capacitor set SCPk, such that the first CDAC 120 generates the increased second voltage VPk, where the voltage value VP(k) thereof is shown as a following equation (3).

$$VP(k)=VP(k-1)+Vr/2^k \qquad \text{equation (3)}$$

Then, in step S548, the comparator 140 is applied to compare the voltage value VP(k) of the second voltage VPk with the voltage value of the comparison reference voltage Vr to obtain the corresponding second comparison result CQ2_k. Thereafter, in step S555, the controller 160 determines whether the voltage value VP(k) of the second voltage VPk is greater than the voltage value of the comparison reference voltage Vr according to the second comparison result CQ2_k. If the determination result of the step S555 is affirmative (for example, the second comparison result CQ2_k is the logic 1), a step S556 is executed, by which the controller 160 is applied to switch the switch WPk of the switching capacitor set SCPk back to the state before the switching, such that the voltage value VP(k) of the second voltage VPk output by the first CDAC 120 is shown as the equation (2). If the determination result of the step S555 is negative (for example, the second comparison result CQ2_k is the logic 0), a step S557 is executed, by which the controller 160 is applied to maintain the switch WPk of the switching capacitor set SCPk at the state after the switching, such that the voltage value VP(k) of the second voltage VPk output by the first CDAC 120 is shown as the equation (3).

Then, in step S5581, the controller 160 may set k=k+1, and in step S5582, it is determined whether k is greater than M (i.e. bit numbers of the window). If the determination result of the step S5582 is negative, the step S546 is returned to perform a next iteration. If the determination result of the step S5582 is affirmative, it represents that the SAR ADC 100 has completed the M-bit window operation.

Since enough instructions and recommendations for other details of the method for operating the SAR ADC of the present embodiment may be learned from the embodiments of FIG. 1 to FIG. 4, details thereof are not repeated.

Figure 7:
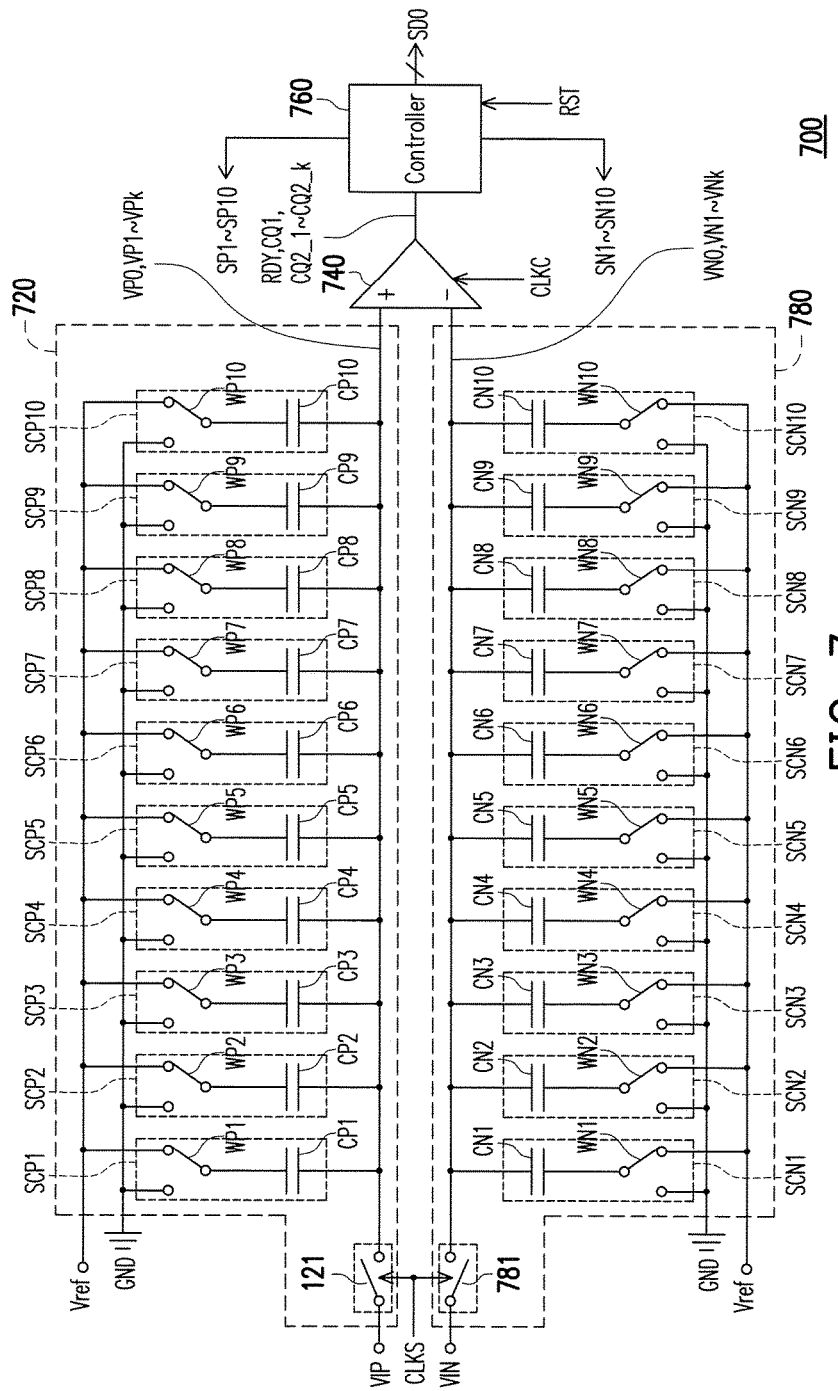
FIG. 7 is a circuit block schematic diagram of a SAR ADC according to another embodiment of the disclosure.

Referring to FIG. 7, FIG. 7 is a circuit block schematic diagram of a SAR ADC 700 according to another embodiment of the disclosure. The SAR ADC 700 is a differential input type ADC. The SAR ADC 700 is used for converting a differential pair signal (including the first analog input signal VIP and a second analog input signal VIN) into the digital output signal SDO, where the digital output signal SDO has N bits calculated from the most significant bit (MSB) to the least significant bit (LSB), where N is a positive integer. For simplicity's sake, it is assumed that N is 10 as an example, and the other embodiments where N is other positive integers may be deduce by analogy.

The SAR ADC 700 may include a first CDAC 720, a second CDAC 780, a comparator 740 (a single comparator) and a controller 760. Structures of the first CDAC 720, the comparator 740 and the controller 760 are respectively similar to that of the first CDAC 120, the comparator 140 and the controller 160 of FIG. 1, which may be deduced with reference of the related descriptions of FIG. 1, and details thereof are not repeated.

The second CDAC 780 may include a sampling switch 781 and switching capacitor sets SCN1-SCN10. The second CDAC 780 may receive and sample the second analog input signal VIN through the sampling switch 781 at a time point to generate a third voltage VN0. The sampling switch 781 is, for example, a bootstrapped switch controlled by a sampling clock signal CLKS. The second CDAC 780 is controlled by a plurality of the second control signals SN1-SN10 to respectively control switching operations of the switching capacitor sets SCN1-SCN10. In detail, a switching capacitor set SCNi may include a capacitor CNi and a switch WNi, where i is an integer from 1 to 10. First ends of the capacitors CN1-CN10 are coupled to an inverting input terminal of the comparator 740, and second ends of the capacitors CN1-CN10 are switched between the first reference voltage Vref and the ground voltage GND through the corresponding switches WN1-WN10. The switches WN1-WN10 are respectively controlled by the second control signals SN1-SN10. Capacitances of the capacitors CN1-CN8 are respectively twice of the capacitances of the capacitors CN2-CN9, and the capacitance of the capacitor CN9 is equal to a capacitance of the capacitor CN10.

In view of operations, the comparator 740 receives the first voltage VP0 from the first CDAC 720 and the third voltage VN0 from the second CDAC 780. The comparator 740 is controlled by the comparison clock signal CLKC to compare a difference of the first voltage VP0 and the third voltage VN0 with a zero crossing point value to generate a first comparison result CQ1. Particularly, the controller 760 may generate the first control signals SP1-SP10 and the second control signals SN1-SN10 according to the first comparison result CQ1, so as to respectively control the switching operations of the switching capacitor sets SCP1-SCP10 and the switching capacitor sets SCN1-SCN10.

Further, the controller 760 has a binary window function. The controller 760 may determine the switching operations of at least one of the switching capacitor sets SCP1-SCP10 and at least one of the switching capacitor sets SCN1-SCN10 according to the output (i.e. the first comparison result CQ1) of the comparator 740, so as to approximate the output of the first CDAC 720 and the output of the second CDAC 780 to the aforementioned binary window, where the above binary window is an M-bit window, and M is a positive integer smaller than or equal to N. In detail, in a k-th iteration of M iterations (k is smaller than or equal to M) of the SAR ADC 700, the controller 760 switches a k-th switching capacitor set SCPk in the switching capacitor sets SCP1-SCP10 (for example, from the first state to the second state), such that the first CDAC 720 generates the corresponding second voltage VPk. Moreover, the controller 760 may switch a k-th switching capacitor set SCNk in the switching capacitor sets SCN1-SCN10 (for example, from the first state to the second state), such that the second CDAC 780 generates a corresponding fourth voltage VNk. Then, the comparator 740 may compare a difference of the second voltage VPk and the fourth voltage VNk of the k-th iteration with the zero crossing point value (for example, 0 volt) to generate a corresponding second comparison result CQ2_k. The controller 760 may define (or determine) a window region WINk according to the first comparison result CQ1 and the second comparison result CQ2_k. Moreover, the controller 760 may determine whether to switch the k-th switching capacitor set SCPk of the first CDAC 720 and the k-th switching capacitor set SCNk of the second CDAC 780 back to the first state (i.e. the state before the switching) or maintain the same at the second state (i.e. the state after the switching) according to the first comparison result CQ1 and the second comparison result CQ2_k.

Figure 8:
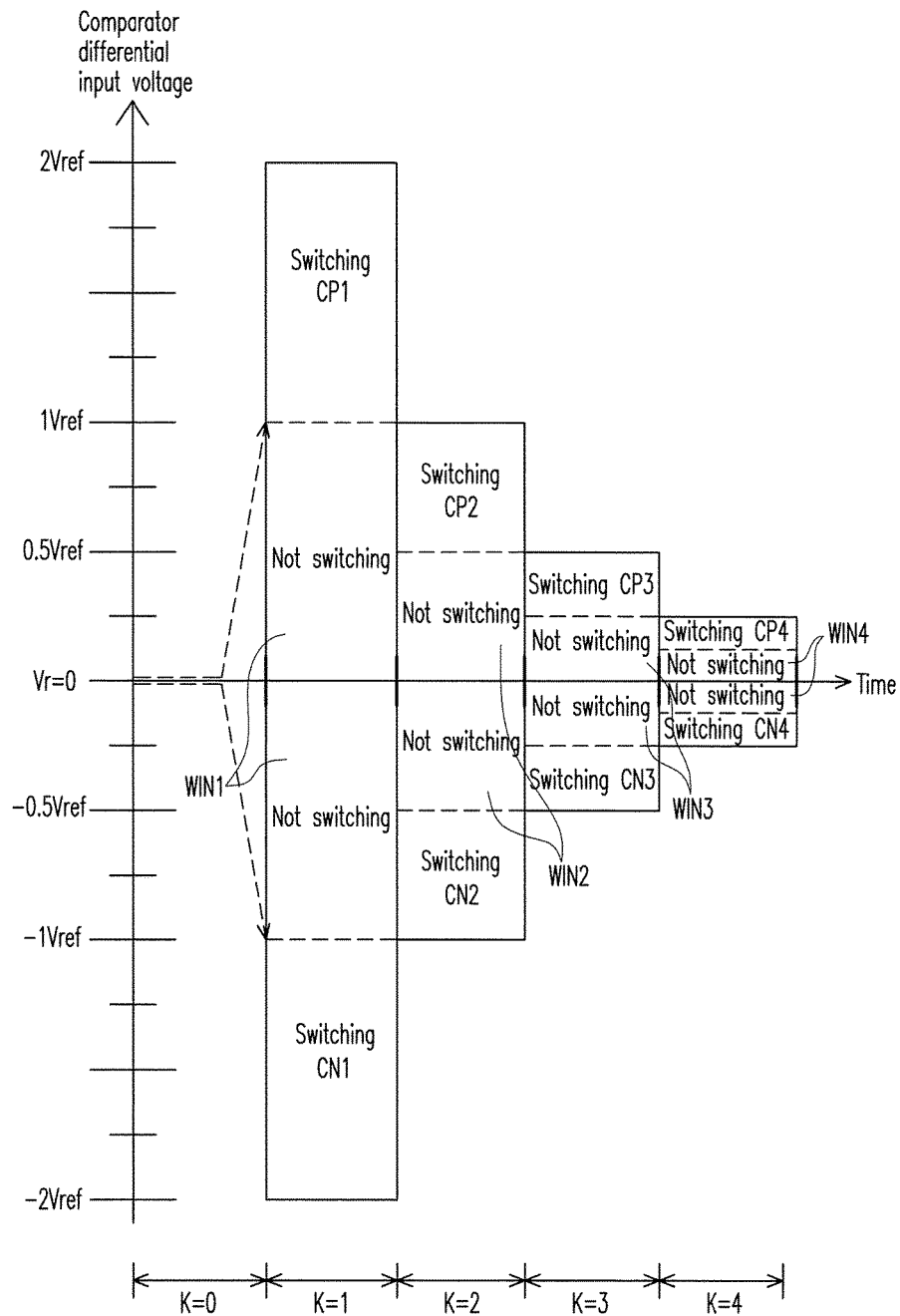
FIG. 8 is a schematic diagram of a switching mechanism of a differential input type SAR ADC executing the binary window function according to another embodiment of the disclosure.

Referring to FIG. 7 and FIG. 8, FIG. 8 is a schematic diagram of a switching mechanism of a differential input type SAR ADC executing the binary window function according to another embodiment of the disclosure, in which a horizontal axis represents time, and a vertical axis represents voltage differences of output voltages of the first CDAC 720 and output voltages of the second CDAC 780 (i.e. differential input voltages of the comparator 740). For simplicity's sake, it is assumed that M is equal to 4 (i.e. the binary window is 4-bit window) as an example, and the embodiments where M is other positive integers may be deduced by analogy. Based on the fact that the binary window is the 4-bit window, four window regions, i.e. WIN1-WIN4 encircled by dot lines are respectively indicated in a first iteration (i.e. k=1) to a fourth iteration (i.e. k=4) as shown in FIG. 7.

First, in the sample-and-hold operation (i.e. k=0), the first CDAC 720 controls the sampling switch 121 through the sampling clock signal CLKS to receive and sample the first analog input signal VIP to generate the first voltage VP0, and the second CDAC 780 controls the sampling switch 781 through the sampling clock signal CLKS to receive and sample the second analog input signal VIN to generate the third voltage VN0. It should be noted that amplitudes of the first analog input signal VIP and the second analog input signal VIN are, for example, both equal to the first reference voltage Vref, and common mode voltages of the first analog input signal VIP and the second analog input signal VIN are, for example, both the same, and a phase difference between the first analog input signal VIP and the second analog input signal VIN is, for example, 180 degrees. The comparator 740 is controlled by the comparison clock signal CLKC to determine whether a difference between the first voltage VP0 and the third voltage VN0 is greater than the zero crossing point value, so as to generate the first comparison result CQ1. Then, in the first iteration (i.e. k=1), the controller 760 may generate the first control signal SP1 and the second control signal SN1 according to the first comparison result CQ1 to control the switching operations of the switching capacitor sets SCP1 and SCN1. The situation that the difference between the first voltage VP0 and the third voltage VN0 is greater than the zero crossing point value (i.e. VP0−VN0>0) is first described below.

In the sample-and-hold operation (i.e. k=0), if the difference between the first voltage VP0 and the third voltage VN0 is greater than the zero crossing point value, the comparator 740 may output the first comparison result CQ1 which is, for example, logic 1. Therefore, in the first iteration (i.e. k=1), the controller 760 switches the switch WP1 of the switching capacitor set SCP1 to decrease the first voltage VP0, such that the first CDAC 720 generates the corresponding second voltage VP1, where VP1=VP0−(Vref/2). Meanwhile, the controller 760 switches the switch WN1 of the switching capacitor set SCN1 to increase the third voltage VN0, such that the second CDAC 780 generates the corresponding fourth voltage VN1, where VN1=VN0+(Vref/2). Then, the comparator 740 may compare the second voltage VP1 and the fourth voltage VN1 of the first iteration (i.e. k=1) to determine whether a difference between the second voltage VP1 and the fourth voltage VN1 is greater than the zero crossing point value. If the difference between the second voltage VP1 and the fourth voltage VN1 is greater than the zero crossing point value, the comparator 740 outputs the second comparison result CQ2_1 which is, for example, the logic 1. It should be noted that if the difference between the second voltage VP1 and the fourth voltage VN1 is greater than the zero crossing point value, it represents that the difference between the first voltage VP0 and the third voltage VN0 is greater than Vref and is located outside the window region WIN1, and the controller 760 maintains the switch WP1 of the switching capacitor set SCP1 and the switch WN1 of the switching capacitor set SCN1 at the state after the switching, and now the difference between the second voltage VP1 and the fourth voltage VN1 is VP1−VN1=[VP0−(Vref/2)]−[VN0+(Vref/2)]=(VP0−VN0)−Vref. Comparatively, if the difference between the second voltage VP1 and the fourth voltage VN1 is smaller than the zero crossing point value, the comparator 740 outputs the second comparison result CQ2_1 which is, for example, logic 0. It should be noted that if the difference between the second voltage VP1 and the fourth voltage VN1 is smaller than the zero crossing point value, it represents that the difference between the first voltage VP0 and the third voltage VN0 is smaller than Vref and is located inside the window region WIN1, and the controller 760 switches the switch WP1 of the switching capacitor set SCP1 and the switch WN1 of the switching capacitor set SCN1 back to the state before the switching, and now the difference between the second voltage VP1 and the fourth voltage VN1 is VP1−VN1=VP0−VN0.

Then, in the second iteration (i.e. k=2), the controller 760 switches the switch WP2 of the switching capacitor set SCP2 to decrease the second voltage VP1, such that the first CDAC 720 generates the corresponding second voltage VP2, where VP2=VP1−(Vref/4). Meanwhile, the controller 760 switches the switch WN2 of the switching capacitor set SCN2 to increase the fourth voltage VN1, such that the second CDAC 780 generates the corresponding fourth voltage VN2, where VN2=VN1+(Vref/4). Then, the comparison 740 may compare the second voltage VP2 and the fourth voltage VN2 of the second iteration (i.e. k=2) to determine whether a difference between the second voltage VP2 and the fourth voltage VN2 is greater than the zero crossing point value. If the difference between the second voltage VP2 and the fourth voltage VN2 is greater than the zero crossing point value, the comparator 740 outputs a second comparison result CQ2_2 which is, for example, the logic 1. It should be noted that if the difference between the second voltage VP2 and the fourth voltage VN2 is greater than the zero crossing point value, it represents that the difference between the second voltage VP1 and the fourth voltage VN1 is greater than 0.5 Vref and is located outside the window region WIN2, and the controller 760 maintains the switch WP2 of the switching capacitor set SCP2 and the switch WN2 of the switching capacitor set SCN2 at the state after the switching, and now VP2−VN2=[VP1−(Vref/4)]−[VN1+(Vref/4)]−(VP1−VN1)−0.5 Vref. Comparatively, if the difference between the second voltage VP2 and the fourth voltage VN2 is smaller than the zero crossing point value, the comparator 740 outputs the second comparison result CQ2_2 which is, for example, the logic 0. It should be noted that if the difference between the second voltage VP2 and the fourth voltage VN2 is smaller than the zero crossing point value, it represents that the difference between the second voltage VP1 and the fourth voltage VN1 is smaller than 0.5 Vref and is located inside the window region WIN2, and the controller 760 switches the switch WP2 of the switching capacitor set SCP2 and the switch WN2 of the switching capacitor set SCN2 back to the state before the switching, and now VP2−VN2=(VP1−VN1).

The switching operations of the first CDAC 720 and the second CDAC 780 in the third iteration (i.e. k=3) and the fourth iteration (i.e. k=4) may be deduced according to the related descriptions of the first iteration (i.e. k=1) and the second iteration (i.e. k=2), and details thereof are not repeated. It should be noted that under the situation that the difference between the first voltage VP0 and the third voltage VN0 is greater than the zero crossing point value, the controller 760 controls the switching operations of the first CDAC 720 and the second CDAC 780 according to the first comparison result CQ1 and the second comparison result CQ2_k.

On the other hand, under the situation that the difference between the first voltage VP0 and the third voltage VN0 is smaller than the zero crossing point value, the controller 760 controls the switching operations of the first CDAC 720 and the second CDAC 780 according to the first comparison result CQ1 and the second comparison result CQ2_k, and a detail thereof may be deduced according to the aforementioned description, which is not repeated.

Figure 9:
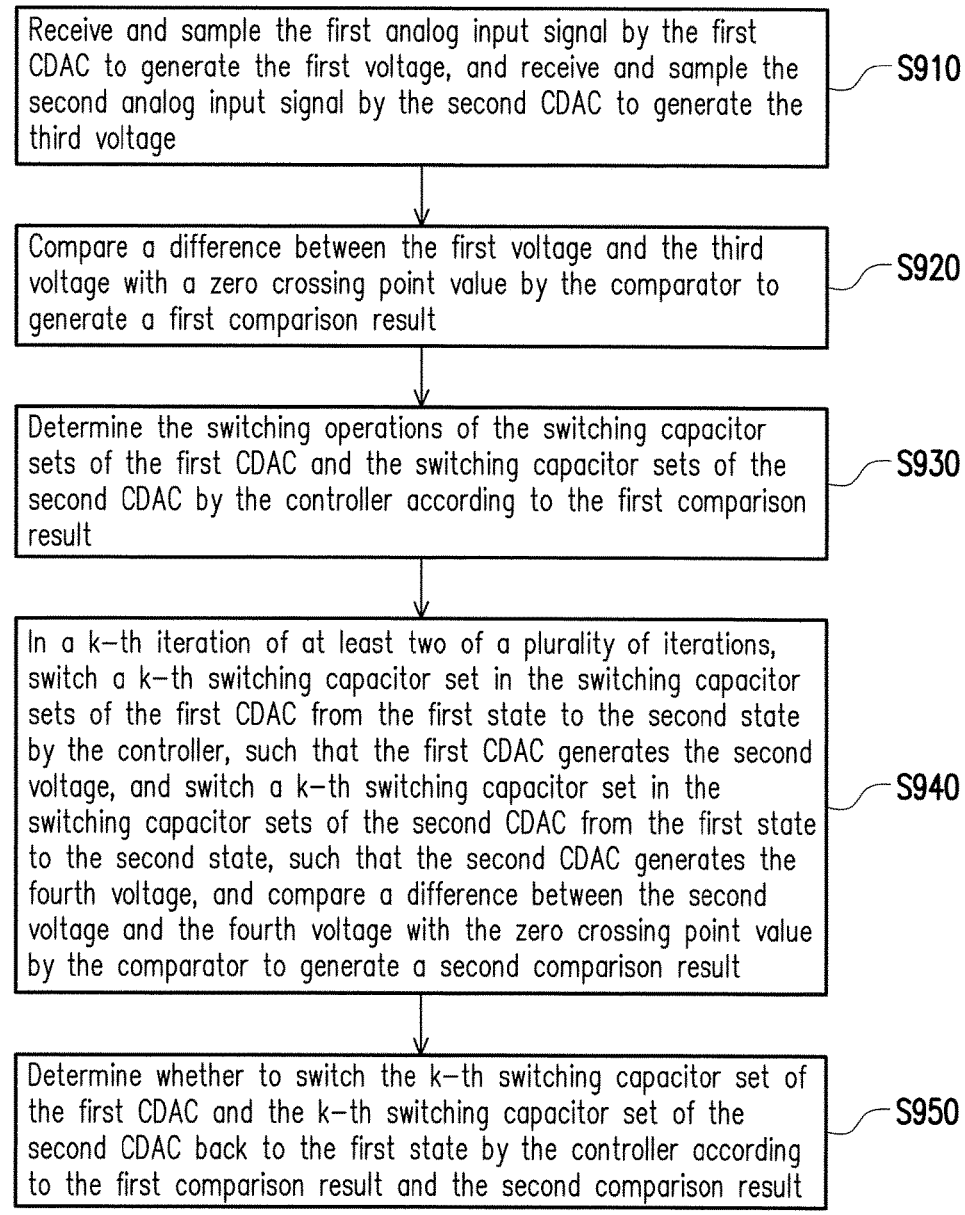
FIG. 9 is a flowchart illustrating a method for operating a SAR ADC according to another embodiment of the disclosure.

FIG. 9 is a flowchart illustrating a method for operating a SAR ADC according to another embodiment of the disclosure, which is used for executing an M-bit window function. Referring to FIG. 7 and FIG. 9 together, after the SAR ADC 700 starts to operate, in step S910, the first CDAC 720 is applied to receive and sample the first analog input signal VIP to generate the first voltage VP0, and the second CDAC 780 is applied to receive and sample the second analog input signal VIN to generate the third voltage VN0. Then, in step S920, the comparator 740 is applied to compare the difference between the first voltage VP0 and the third voltage VN0 with the zero crossing point value to generate the first comparison result CQ1. Then, in step S930, the controller 760 is applied to determine the switching operations of the switching capacitor sets SCP1-SCP10 of the first CDAC 720 and the switching capacitor sets SCN1-SCN10 of the second CDAC 780 according to the first comparison result CQ1.

Then, in a k-th iteration of at least two of a plurality of iterations, the controller 760 is applied to switch a k-th switching capacitor set in the switching capacitor sets SCP1-SCP10 of the first CDAC 720 from the first state to the second state, such that the first CDAC 720 generates the second voltage VPk, and switch a k-th switching capacitor set in the switching capacitor sets SCN1-SCN10 of the second CDAC 780 from the first state to the second state, such that the second CDAC 780 generates the fourth voltage VNk, and the comparator 740 is applied to compare a difference between the second voltage VPk and the fourth voltage VNk with the zero crossing point value to obtain a second comparison result CQ2_k, as shown in step S940. Then, in step S950, the controller 760 is applied to determine whether to switch the k-th switching capacitor set of the first CDAC 720 and the k-th switching capacitor set of the second CDAC 780 back to the first state according to the first comparison result CQ1 and the second comparison result CQ2_k.

Figure 10:
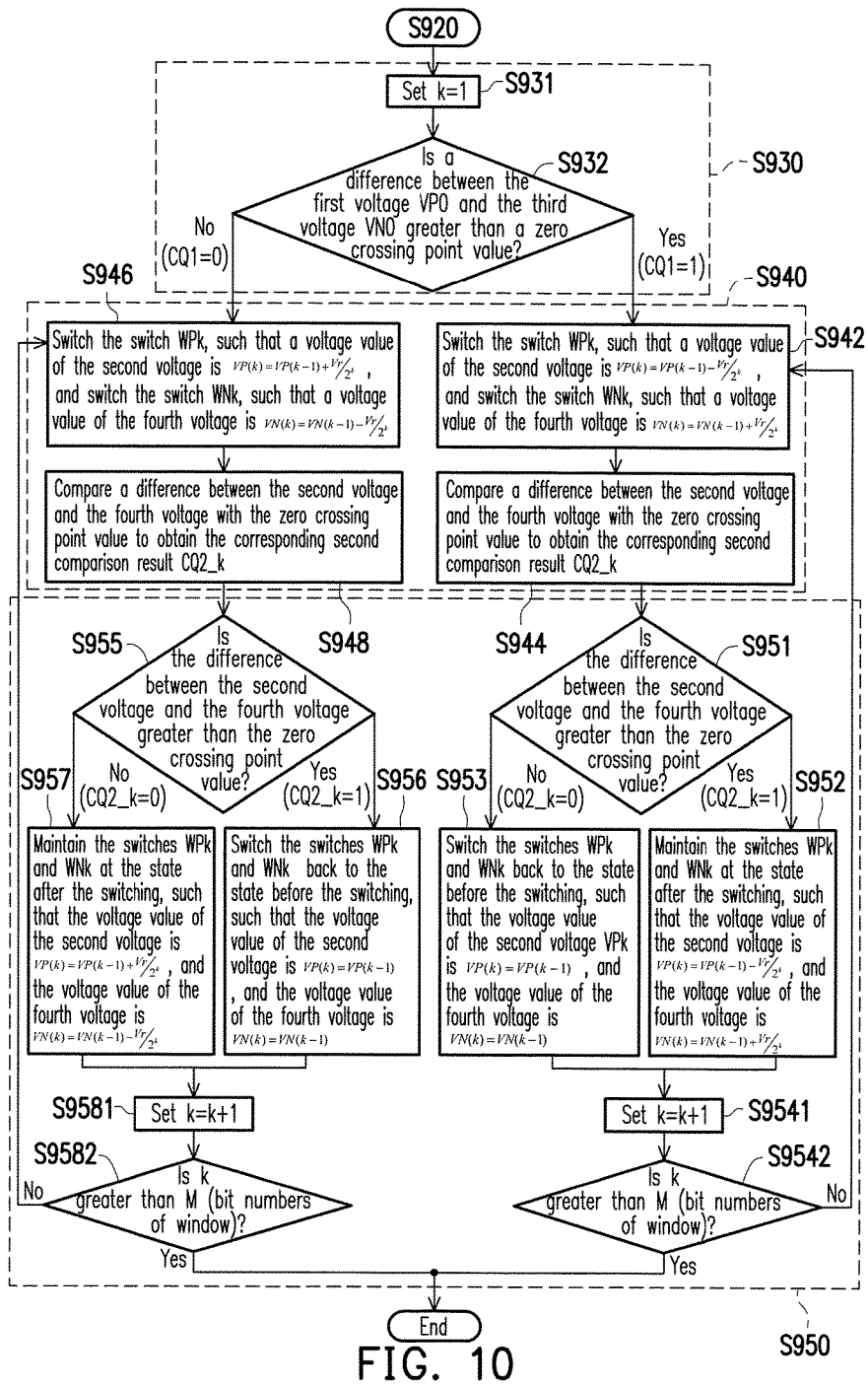
FIG. 10 is a flowchart illustrating detailed steps of steps S930, S940 and S950 of FIG. 9 according to another embodiment of the disclosure.

Referring to FIG. 9 and FIG. 10 together, FIG. 10 is a flowchart illustrating detailed steps of the steps S930, S940 and S950 of FIG. 9 according to an embodiment of the disclosure. First, in step S931, the controller 760 sets k to 1. Then, in step S932, the controller 760 determines whether the difference between the first voltage VP0 and the third voltage VN0 is greater than the zero crossing point value according to the first comparison result CQ1, so as to start the iterations.

If the determination result of the step S932 is affirmative (for example, the first comparison result CQ1 is the logic 1), a step S942 is executed, by which the controller 760 is applied to switch the switch WPk of the switching capacitor set SCPk, such that the first CDAC 720 generates the decreased second voltage VPk, and a voltage value VP(k) thereof is shown as the aforementioned equation (1). Meanwhile, the controller 760 is applied to switch the switch WNk of the switching capacitor set SCNk, such that the second CDAC 780 generates the increased fourth voltage VNk, and a voltage value VN(k) thereof is shown as a following equation (4).

$$VN(k)=VN(k-1)+Vr/2^k \quad \text{equation (4)}$$

Then, in step S944, the comparator 740 is applied to compare a difference between the second voltage VPk and the fourth voltage VNk with the zero crossing point value to obtain the corresponding second comparison result CQ2_k. Thereafter, in step S951, the controller 760 determines whether the difference between the second voltage VPk and the fourth voltage VNk is greater than the zero crossing point value according to the second comparison result CQ2_k. If the determination result of the step S951 is affirmative (for example, the second comparison result CQ2_k is the logic 1), a step S952 is executed, by which the controller 760 is applied to maintain the switch WPk of the switching capacitor set SCPk and the switch WNk of the switching capacitor set SCNk at the state after the switching, such that the voltage value VP(k) of the second voltage VPk output by the first CDAC 720 is shown as the equation (1), and the voltage value VN(k) of the fourth voltage VNk output by the second CDAC 780 is shown as the equation (4). If the determination result of the step S951 is negative (for example, the second comparison result CQ2_k is the logic 0), a step S953 is executed, by which the controller 760 is applied to switch the switch WPk of the switching capacitor set SCPk and the switch WNk of the switching capacitor set SCNk back to the state before the switching, such that the voltage value VP(k) of the second voltage VPk output by the first CDAC 720 is shown as the above equation (2), and the voltage value VN(k) of the fourth voltage VNk output by the second CDAC 780 is shown as a following equation (5).

$$VN(k)=VN(k-1) \quad (5)$$

Then, in step S9541, the controller 760 may set k=k+1, and in step S9542, it is determined whether k is greater than M (i.e. bit numbers of the window). If the determination result of the step S9542 is negative, the step S942 is returned to perform a next iteration. If the determination result of the step S9542 is affirmative, it represents that the SAR ADC 700 has completed the M-bit window operation.

On the other hand, if the determination result of the step S932 is negative (for example, the first comparison result CQ1 is the logic 0), a step S946 is executed, by which the controller 760 is applied to switch the switch WPk of the switching capacitor set SCPk, such that the first CDAC 720 generates the increased second voltage VPk, where the voltage value VP(k) thereof is shown as the above equation (3). Meanwhile, the controller 760 is applied to switch the switch WNk of the switching capacitor set SCNk, such that the second CDAC 780 generates the decreased fourth voltage VNk, where the voltage value VN(k) thereof is shown as a following equation (6).

$$VN(k)=VN(k-1)-Vr/2^k \quad (6)$$

Then, in step S948, the comparator 740 is applied to compare the difference between the second voltage VPk and the fourth voltage VNk with the zero crossing point value to obtain the corresponding second comparison result CQ2_k. Thereafter, in step S955, the controller 760 may determine whether the difference between the second voltage VPk and the fourth voltage VNk is greater than the zero crossing point value according to the second comparison result CQ2_k. If the determination result of the step S955 is affirmative (for example, the second comparison result CQ2_k is the logic 1), a step S956 is executed, by which the controller 760 is applied to switch the switch WPk of the switching capacitor set SCPk and the switch WNk of the switching capacitor set SCNk back to the state before the switching, such that the voltage value VP(k) of the second voltage VPk output by the first CDAC 720 is shown as the equation (2), and the voltage value VN(k) of the fourth voltage VNk output by the second CDAC 780 is shown as the equation (5). If the determination result of the step S955 is negative (for example, the second comparison result CQ2_k is the logic 0), a step S957 is executed, by which the controller 760 is applied to maintain the switch WPk of the switching capacitor set SCPk and the switch WNk of the switching capacitor set SCNk at the state after the switching, such that the voltage value VP(k) of the second voltage VPk output by the first CDAC 720 is shown as the equation (3), and the voltage value VN(k) of the fourth voltage VNk output by the second CDAC 780 is shown as the equation (6).

Then, in step S9581, the controller 760 may set k=k+1, and in step S9582, it is determined whether k is greater than M (i.e. bit numbers of the window). If the determination result of the step S9582 is negative, the step S946 is returned to perform a next iteration. If the determination result of the step S9582 is affirmative, it represents that the SAR ADC 700 has completed the M-bit window operation.

Moreover, since enough instructions and recommendations for other details of the method for operating the SAR ADC 700 of the present embodiment may be learned from the embodiments of FIG. 1 to FIG. 8, details thereof are not repeated.

Figure 11A:
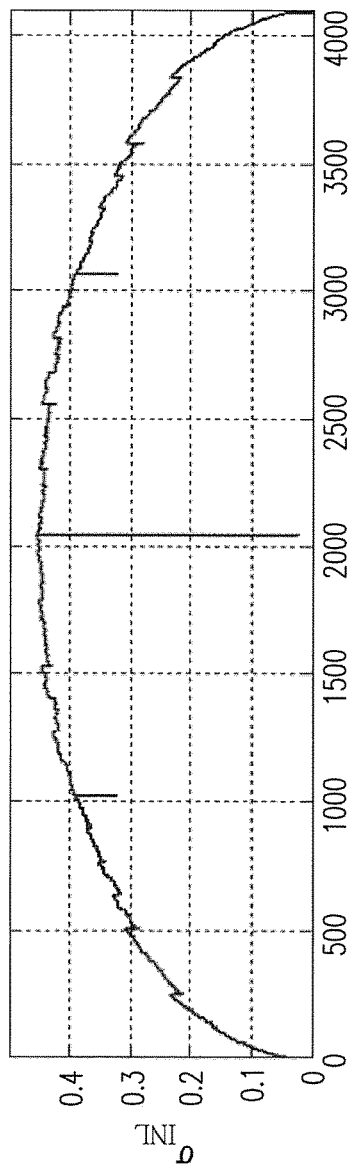
FIG. 11A is a schematic diagram of integral nonlinearity of a SAR ADC without adopting the operation of binary window.
Figure 11B:
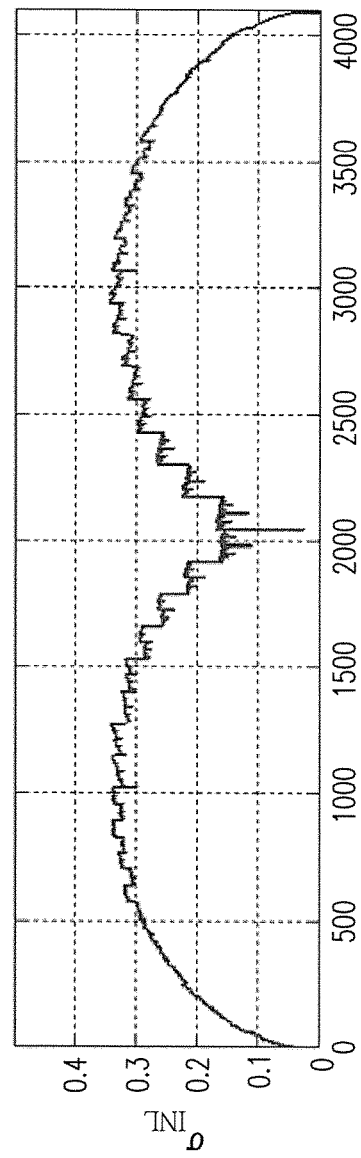
FIG. 11B is a schematic diagram of integral nonlinearity of a SAR ADC according to an embodiment of the disclosure.

Referring to FIG. 11A and FIG. 11B together, FIG. 11A is a schematic diagram of integral nonlinearity of a SAR ADC without adopting the operation of binary window, and FIG. 11B is a schematic diagram of integral nonlinearity of a SAR ADC according to an embodiment of the disclosure, in which a horizontal axis represents digital codes (12 bits) of the digital output signal of the SAR ADC, and a vertical axis represents a standard deviation of the integral nonlinearity corresponding to each of the digital codes. According to FIG. 11A and FIG. 11B, it is known that through the operation of the binary window, in the CDAC, a chance of switching at least one switching capacitor set (for example, the switching capacitor sets SCP1, SCN1 of FIG. 7) corresponding to the MSB is decreased. In this way, the integral nonlinearity of the SAR ADC is ameliorated.

Figure 12:
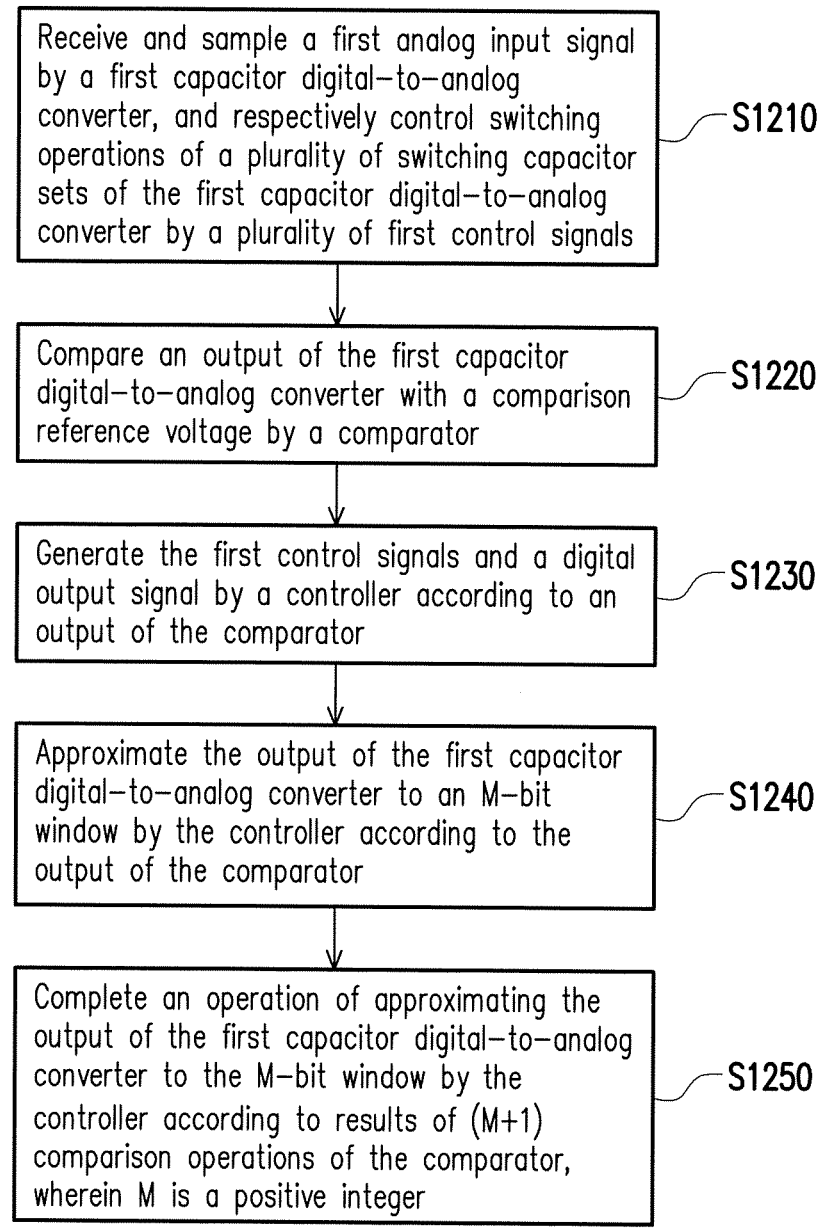
FIG. 12 is a flowchart illustrating a method for operating a SAR ADC according to yet another embodiment of the disclosure.

Moreover, as described above, in the SAR ADC 100 of the embodiment of FIG. 1 of the disclosure, the controller 160 may complete the operation of approximating the output of the first CDAC 120 to the M-bit window through (M+1) comparison operation results of the single comparator 140. In detail, FIG. 12 is a flowchart illustrating a method for operating a SAR ADC according to yet another embodiment of the disclosure, which is used for executing an M-bit window function. Referring to FIG. 1 and FIG. 12 together, after the SAR ADC 100 starts to operate, in step S1210, the first CDAC 120 is applied to receive and sample the first analog input signal VIP and respectively control switching operations of the plurality of switching capacitor sets SCP1-SCP10 of the first CDAC 120 according to the plurality of first control signals SP1-SP10. Then, in step S1220, the comparator 140 is applied to compare the output of the first CDAC 120 with the comparison reference voltage Vr. Then, in step S1230, the controller 160 is applied to generate the first control signals SP1-SP10 and the digital output signal SDO according to the output of the comparator 140. Then, the controller 160 is applied to approximate the output of the first CDAC 120 to the M-bit window according to the output of the comparator 140, as shown in step S1240. Then, in step S1250, the controller 160 is applied to complete an operation of approximating the output of the first CDAC 120 to the M-bit window according to results of (M+1) comparison operations of the comparator 140. In view of dynamic power consumption, the dynamic power consumption of the SAR ADC is proportional to the number of the comparators therein and the number of comparison operations of the comparators. Therefore, the SAR ADC of the disclosure has the characteristics of less number of the comparators and less number of the comparison operations, so that under a same operation speed, the dynamic power consumption of the SAR ADC of the disclosure may be effectively decreased to achieve a power saving effect. Similarly, under the same dynamic power consumption, an operation speed of the SAR ADC of the disclosure may be effectively increased.

The SAR ADC having the binary window function and the method for operating the same provided by some embodiments of the disclosure may not only improve the operation speed and decrease the dynamic power consumption thereof, but may also improve the integral nonlinearity of the CDAC thereof.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A successive approximation register analog-to-digital converter, configured to convert a first analog input signal into a digital output signal, the successive approximation register analog-to-digital converter comprising:
   a first capacitor digital-to-analog converter, configured to receive and sample the first analog input signal to generate a first voltage;
   a comparator, coupled to the first capacitor digital-to-analog converter to receive the first voltage, and comparing the first voltage with a comparison reference voltage to generate a first comparison result; and
   a controller, coupled to the comparator and the first capacitor digital-to-analog converter, and configured to determine switching operations of a plurality of switching capacitor sets of the first capacitor digital-to-analog converter according to the first comparison result,
   wherein in a k-th iteration of at least two of a plurality of iterations, the controller switches a k-th switching capacitor set in the switching capacitor sets from a first state to a second state, such that the first capacitor digital-to-analog converter generates a second voltage, and the comparator compares the second voltage with the comparison reference voltage to generate a second comparison result, where k is a positive integer,
   wherein the controller determines a window region and determines whether to switch the k-th switching capacitor set back to the first state according to the first comparison result and the second comparison result.

2. The successive approximation register analog-to-digital converter as claimed in claim 1, wherein
   when the first comparison result represents that the first voltage is greater than the comparison reference voltage, and the second comparison result represents that the second voltage is greater than the comparison reference voltage, the controller maintains the k-th switching capacitor set at the second state; or
   when the first comparison result represents that the first voltage is smaller than the comparison reference voltage, and the second comparison result represents that the second voltage is smaller than the comparison reference voltage, the controller maintains the k-th switching capacitor set at the second state.

3. The successive approximation register analog-to-digital converter as claimed in claim 1, wherein
   when the second comparison result and the first comparison result represent that one of the first voltage and the second voltage is greater than the comparison reference voltage, and another of the first voltage and the second voltage is smaller than the comparison reference voltage, the controller switches the k-th switching capacitor set back to the first state.

4. The successive approximation register analog-to-digital converter as claimed in claim 1, wherein
   after all of the iterations are completed, the controller generates the digital output signal corresponding to the analog input signal according to the first comparison result and the second comparison result of each of the iterations.

5. The successive approximation register analog-to-digital converter as claimed in claim 1, wherein the comparison reference voltage is a zero crossing point value, and the successive approximation register analog-to-digital converter further comprises:
   a second capacitor digital-to-analog converter, coupled to the comparator and the controller, and configured to receive and sample a second analog input signal to generate a third voltage, where the second analog input signal and the first analog input signal are a differential pair signal,
   wherein the comparator compares a difference between the first voltage and the third voltage with the zero crossing point value to obtain the first comparison result, and the controller determines switching operations of the switching capacitor sets of the first capacitor digital-to-analog converter and switching operations of a plurality of switching capacitor sets of the second capacitor digital-to-analog converter according to the first comparison result,
   wherein in the k-th iteration of the at least two iterations, the controller switches a k-th switching capacitor set in the switching capacitor sets of the second capacitor digital-to-analog converter from the first state to the second state, such that the second capacitor digital-to-analog converter generates a fourth voltage, and the comparator compares a difference between the second voltage and the fourth voltage with the zero crossing point value to obtain the second comparison result,
   wherein the controller determines whether to switch the k-th switching capacitor set of the first capacitor digital-to-analog converter and the k-th switching capacitor set of the second capacitor digital-to-analog converter back to the first state according to the first comparison result and the second comparison result.

6. The successive approximation register analog-to-digital converter as claimed in claim 5, wherein
   when the first comparison result represents that the difference between the first voltage and the third voltage is greater than the zero crossing point value, and the second comparison result represents that the difference between the second voltage and the fourth voltage is greater than the zero crossing point value, the controller maintains the k-th switching capacitor set of the first capacitor digital-to-analog converter and the k-th switching capacitor set of the second capacitor digital-to-analog converter at the second state, or
   when the first comparison result represents that the difference between the first voltage and the third voltage is smaller than the zero crossing point value, and the second comparison result represents that the difference between the second voltage and the fourth voltage is smaller than the zero crossing point value, the controller maintains the k-th switching capacitor set of the first capacitor digital-to-analog converter and the k-th switching capacitor set of the second capacitor digital-to-analog converter at the second state.

7. The successive approximation register analog-to-digital converter as claimed in claim 5, wherein
   when the first comparison result represents that the difference between the first voltage and the third voltage is greater than the zero crossing point value, and the second comparison result represents that the difference between the second voltage and the fourth voltage is smaller than the zero crossing point value, the controller switches the k-th switching capacitor set of the first capacitor digital-to-analog converter and the k-th switching capacitor set of the second capacitor digital-to-analog converter back to the first state, or
   when the first comparison result represents that the difference between the first voltage and the third voltage is smaller than the zero crossing point value, and the second comparison result represents that the difference between the second voltage and the fourth voltage is greater than the zero crossing point value, the controller switches the k-th switching capacitor set of the first capacitor digital-to-analog converter and the k-th switching capacitor set of the second capacitor digital-to-analog converter back to the first state.

8. A successive approximation register analog-to-digital converter, configured to convert a first analog input signal into a digital output signal, the successive approximation register analog-to-digital converter comprising:

a first capacitor digital-to-analog converter, configured to receive and sample the first analog input signal, and controlled by a plurality of first control signals to respectively control switching operations of a plurality of switching capacitor sets of the first capacitor digital-to-analog converter;

a comparator, coupled to the first capacitor digital-to-analog converter, and comparing an output of the first capacitor digital-to-analog converter with a comparison reference voltage; and a controller, coupled to the comparator and the first capacitor digital-to-analog converter, and configured to generate the first control signals and the digital output signal according to an output of the comparator, wherein the controller approximates the output of the first capacitor digital-to-analog converter to an M-bit window according to the output of the comparator, and the controller completes an operation of approximating the output of the first capacitor digital-to-analog converter to the M-bit window according to results of (M+1) comparison operations of the comparator, wherein M is a positive integer.

9. The successive approximation register analog-to-digital converter as claimed in claim 8, wherein the first capacitor digital-to-analog converter samples the first analog input signal to generate a first voltage, the comparator compares the first voltage with the comparison reference voltage to generate a first comparison result, and the controller generates the first control signals according to the first comparison result, wherein in a k-th iteration of M iterations, the controller switches a k-th switching capacitor set in the switching capacitor sets from a first state to a second state, such that the first capacitor digital-to-analog converter generates a second voltage, and the comparator compares the second voltage with the comparison reference voltage to generate a second comparison result, wherein k is smaller than or equal to M, wherein the controller determines a window region and determines whether to switch the k-th switching capacitor set back to the first state according to the first comparison result and the second comparison result.

10. A method for operating a successive approximation register analog-to-digital converter, adapted to convert a first analog input signal into a digital output signal, the method for operating the successive approximation register analog-to-digital converter comprising:

receiving and sampling the first analog input signal by a first capacitor digital-to-analog converter to generate a first voltage;

comparing the first voltage with a comparison reference voltage by a comparator to generate a first comparison result;

determining switching operations of a plurality of switching capacitor sets of the first capacitor digital-to-analog converter by a controller according to the first comparison result;

in a k-th iteration of at least two of a plurality of iterations, switching a k-th switching capacitor set in the switching capacitor sets from a first state to a second state by the controller, such that the first capacitor digital-to-analog converter generates a second voltage, and comparing the second voltage with the comparison reference voltage by the comparator to obtain a second comparison result, wherein k is a positive integer; and determining a window region and determining whether to switch the k-th switching capacitor set back to the first state by the controller according to the first comparison result and the second comparison result.

11. The method for operating the successive approximation register analog-to-digital converter as claimed in claim 10, wherein the step of determining whether to switch the k-th switching capacitor set back to the first state according to the first comparison result and the second comparison result comprises:

when the first comparison result represents that the first voltage is greater than the comparison reference voltage, and the second comparison result represents that the second voltage is greater than the comparison reference voltage, maintaining the k-th switching capacitor set at the second state; or when the first comparison result represents that the first voltage is smaller than the comparison reference voltage, and the second comparison result represents that the second voltage is smaller than the comparison reference voltage, maintaining the k-th switching capacitor set at the second state.

12. The method for operating the successive approximation register analog-to-digital converter as claimed in claim 10, wherein the step of determining whether to switch the k-th switching capacitor set back to the first state according to the first comparison result and the second comparison result comprises:

when the second comparison result and the first comparison result represent that one of the first voltage and the second voltage is greater than the comparison reference voltage, and another of the first voltage and the second voltage is smaller than the comparison reference voltage, switching the k-th switching capacitor set back to the first state.

13. The method for operating the successive approximation register analog-to-digital converter as claimed in claim 10, further comprising:

after all of the iterations are completed, generating the digital output signal corresponding to the analog input signal by the controller according to the first comparison result and the second comparison result of each of the iterations.

14. The method for operating the successive approximation register analog-to-digital converter as claimed in claim 10, further comprising:

receiving and sampling a second analog input signal by a second capacitor digital-to-analog converter to generate a third voltage, wherein the second analog input signal and the first analog input signal are a differential pair signal;

determining switching operations of a plurality of switching capacitor sets of the second capacitor digital-to-analog converter by the controller according to the first comparison result;

in the k-th iteration of the at least two iterations, switching a k-th switching capacitor set in the switching capacitor sets of the second capacitor digital-to-analog converter from the first state to the second state by the controller, such that the second capacitor digital-to-analog converter generates a fourth voltage; and determining whether to switch the k-th switching capacitor set of the second capacitor digital-to-analog converter back to the first state by the controller according to the first comparison result and the second comparison result, wherein the comparison reference voltage is a zero crossing point value, wherein the step of comparing the first voltage with the comparison reference voltage by the comparator to generate the first comparison result comprises:
comparing a difference between the first voltage and the third voltage with the zero crossing point value by the comparator to obtain the first comparison result, wherein the step of comparing the second voltage with the comparison reference voltage by the comparator to obtain the second comparison result comprises:
comparing a difference between the second voltage and the fourth voltage with the zero crossing point value by the comparator to obtain the second comparison result.

15. The method for operating the successive approximation register analog-to-digital converter as claimed in claim 14, wherein the step of determining whether to switch the k-th switching capacitor set of the first capacitor digital-to-analog converter and the k-th switching capacitor set of the second capacitor digital-to-analog converter back to the first state according to the first comparison result and the second comparison result comprises:

when the first comparison result represents that the difference between the first voltage and the third voltage is greater than the zero crossing point value, and the second comparison result represents that the difference between the second voltage and the fourth voltage is greater than the zero crossing point value, maintaining the k-th switching capacitor set of the first capacitor digital-to-analog converter and the k-th switching capacitor set of the second capacitor digital-to-analog converter at the second state, or when the first comparison result represents that the difference between the first voltage and the third voltage is smaller than the zero crossing point value, and the second comparison result represents that the difference between the second voltage and the fourth voltage is smaller than the zero crossing point value, maintaining the k-th switching capacitor set of the first capacitor digital-to-analog converter and the k-th switching capacitor set of the second capacitor digital-to-analog converter at the second state.

16. The method for operating the successive approximation register analog-to-digital converter as claimed in claim 14, wherein the step of determining whether to switch the k-th switching capacitor set of the first capacitor digital-to-analog converter and the k-th switching capacitor set of the second capacitor digital-to-analog converter back to the first state according to the first comparison result and the second comparison result comprises:

when the first comparison result represents that the difference between the first voltage and the third voltage is greater than the zero crossing point value, and the second comparison result represents that the difference between the second voltage and the fourth voltage is smaller than the zero crossing point value, switching the k-th switching capacitor set of the first capacitor digital-to-analog converter and the k-th switching capacitor set of the second capacitor digital-to-analog converter back to the first state, or when the first comparison result represents that the difference between the first voltage and the third voltage is smaller than the zero crossing point value, and the second comparison result represents that the difference between the second voltage and the fourth voltage is greater than the zero crossing point value, switching the k-th switching capacitor set of the first capacitor digital-to-analog converter and the k-th switching capacitor set of the second capacitor digital-to-analog converter back to the first state.

* * * * *